United States Patent
Liao et al.

(10) Patent No.: US 10,727,117 B2
(45) Date of Patent: Jul. 28, 2020

(54) METHOD FOR MANUFACTURING SEMICONDUCTOR STRUCTURE

(71) Applicant: TAIWAN SEMICONDUCTOR MANUFACTURING COMPANY LTD., Hsinchu (TW)

(72) Inventors: Yu-Hsiang Liao, Hsinchu (TW); Ya-Huei Li, Tainan (TW); Li-Wei Chu, New Taipei (TW); Chun-Wen Nieh, Hsinchu County (TW); Hung-Yi Huang, Hsin-Chu (TW); Chih-Wei Chang, Hsin-Chu (TW); Ching-Hwanq Su, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 12 days.

(21) Appl. No.: 16/130,690

(22) Filed: Sep. 13, 2018

(65) Prior Publication Data
US 2019/0157141 A1    May 23, 2019

Related U.S. Application Data

(60) Provisional application No. 62/588,698, filed on Nov. 20, 2017.

(51) Int. Cl.
| | | |
|---|---|---|
| H01L 21/768 | (2006.01) | |
| H01L 21/285 | (2006.01) | |
| H01L 29/40 | (2006.01) | |
| H01L 29/78 | (2006.01) | |
| H01L 29/66 | (2006.01) | |

(52) U.S. Cl.
CPC .. *H01L 21/76846* (2013.01); *H01L 21/28518* (2013.01); *H01L 21/76831* (2013.01); *H01L 21/76847* (2013.01); *H01L 21/76877* (2013.01); *H01L 29/401* (2013.01); *H01L 29/66545* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |

(Continued)

*Primary Examiner* — Bradley Smith
(74) *Attorney, Agent, or Firm* — WPAT, P.C., Intellectual Property Attorneys; Anthony King

(57) ABSTRACT

A method for manufacturing a semiconductor structure includes following operations. A sacrificial layer is formed over the conductive layer, wherein the sacrificial layer includes a first sacrificial portion over the first conductive portion, and a second sacrificial portion over the second conductive portion, and a first thickness of the first sacrificial portion is larger than a second thickness of the second sacrificial portion. The first sacrificial portion and the second sacrificial portion of the sacrificial layer, and the second conductive portion of the conductive layer are removed, with at least a portion of the first conductive portion remaining over the bottom of the trench.

20 Claims, 29 Drawing Sheets

(56) References Cited

U.S. PATENT DOCUMENTS

| | | | |
|---|---|---|---|
| 9,230,795 B1 * | 1/2016 | Wang | H01L 21/26586 |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,589,892 B2 * | 3/2017 | Lin | H01L 23/528 |
| 2008/0059924 A1 * | 3/2008 | Hsu | H01L 21/76814 |
| | | | 257/508 |
| 2014/0327080 A1 * | 11/2014 | Hung | H01L 29/66515 |
| | | | 257/365 |
| 2019/0097012 A1 * | 3/2019 | Hung | H01L 29/66795 |

* cited by examiner

METHOD FOR MANUFACTURING SEMICONDUCTOR STRUCTURE

CROSS-REFERENCE TO RELATED APPLICATION

This application claims the benefit of U.S. Provisional Application No. 62/588,698, filed on Nov. 20, 2017, which is incorporated by reference in its entirety.

BACKGROUND

Transistors typically include semiconductor regions used to form the source regions and drain regions. The contact resistance between metal conductive vias and the semiconductor regions is high. Accordingly, metal silicides are formed on the surfaces of the semiconductor regions such as silicon regions, germanium regions, silicon germanium regions in order to reduce the contact resistance. The conductive vias are formed to contact the silicide regions, and the contact resistance between the conductive vias and the silicide regions are low.

A typical silicidation process includes forming a metal layer on the surfaces of the semiconductor regions, and then performing an annealing, so that the metal layer reacts with the semiconductor regions to form the silicide regions. After the reaction, the upper portions of the metal layer may be left un-reacted. An etch back operation is then performed to remove the un-reacted portions of the metal layer. However, general etch back operation may induce profile kink of the metal layer, and the profile kink may shrink the contact plug critical dimension window. On the other hand, heavy etch operation may cause bottom silicide layer damage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2, FIG. 3A and FIG. 3B are cross-sectional views of a semiconductor structure fabricated at some stages, in accordance with some embodiments of the present disclosure, wherein

DETAILED DESCRIPTION

Figure 1:
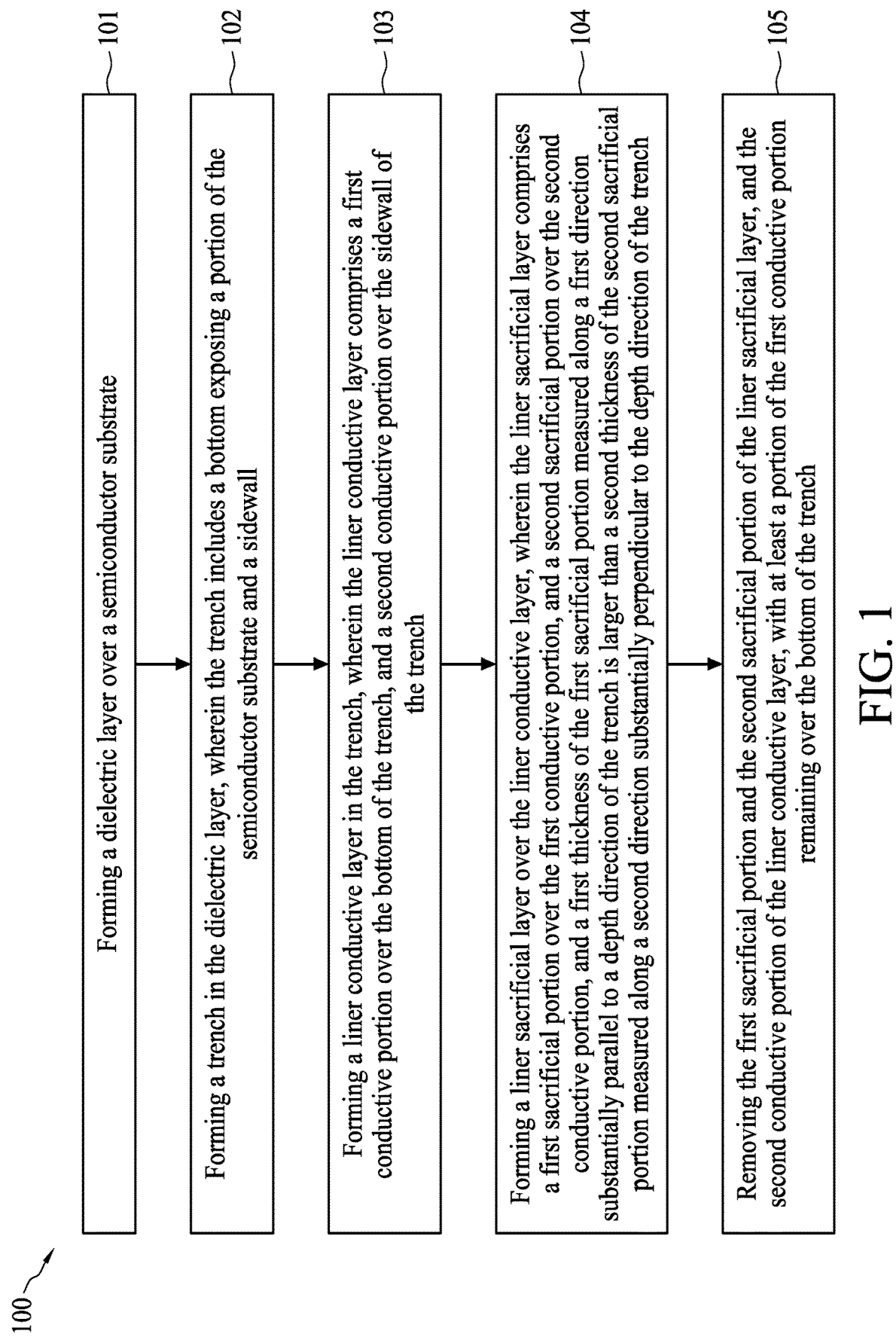
FIG. 1 is a flowchart illustrating a method for manufacturing a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In one or more embodiments according to the present disclosure, a sacrificial layer is formed over the conductive layer. The conductive layer on the sidewall of the trench may be removed along with the sacrificial layer. The sacrificial layer may help to remove the portion of conductive layer near the bottom of the trench. The profile kink issue of the conductive layer near the bottom of the trench or the damage to the conductive layer on the bottom of the trench due to heavy etch operation may be alleviated. Further, the conductive via gap-fill opening may be enlarged and the volume decreasing of the low-resistivity conductive via may be alleviated.

FIG. 1 is a flowchart illustrating a method 100 for manufacturing a semiconductor structure, in accordance with some embodiments of the present disclosure. Referring to FIG. 1, In some embodiments, the method 100 includes operations 101-105. In operation 101, a dielectric layer is formed over a semiconductor substrate. In operation 102, a trench is formed in the dielectric layer, wherein the trench includes a bottom and a sidewall, and the bottom exposes a portion of the semiconductor substrate. In operation 103, a liner conductive layer is formed in the trench, wherein the liner conductive layer includes a first conductive portion over the bottom of the trench, and a second conductive portion over the sidewall of the trench. In operation 104, a liner sacrificial layer is formed over the liner conductive layer, wherein the liner sacrificial layer includes a first sacrificial portion over the first conductive portion, and a second sacrificial portion over the second conductive portion, and a first thickness of the first sacrificial portion measured along a first direction substantially parallel to a depth direction of the trench is larger than a second thickness of the second sacrificial portion measured along a second direction substantially perpendicular to the depth direction of the trench. In operation 105, the first sacrificial portion and the second sacrificial portion of the liner sacrificial layer, and the second conductive portion of the liner conductive layer are removed, with at least a portion of the first conductive portion remaining over the bottom of the trench.

Figure 2:
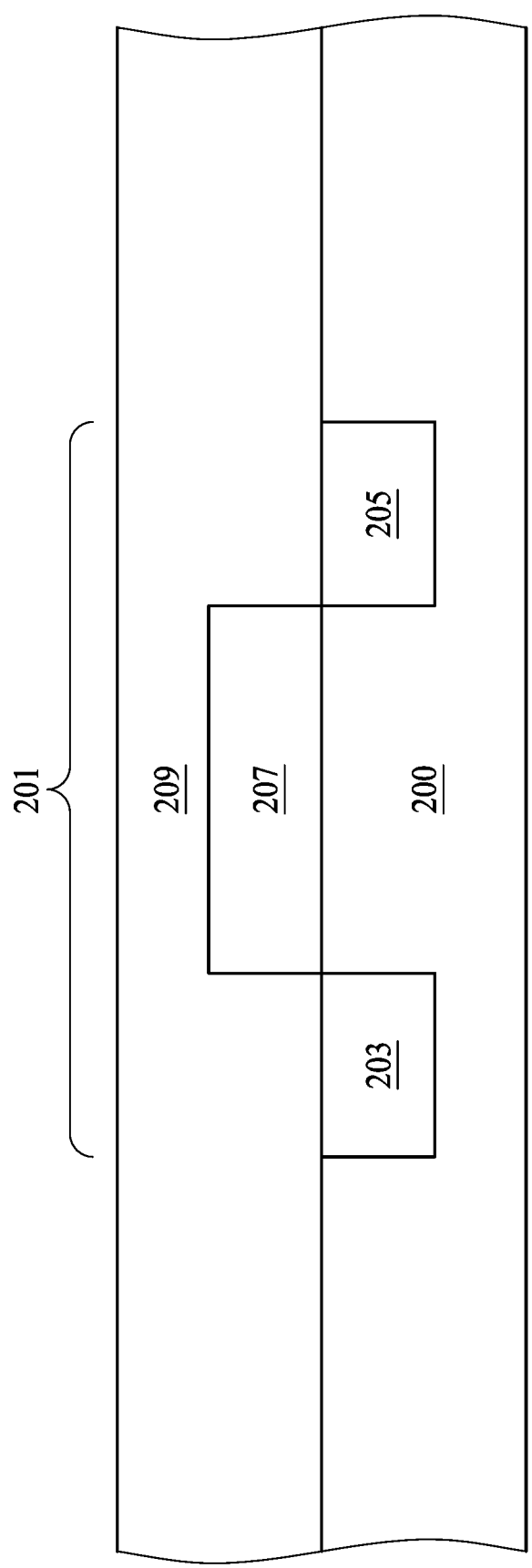
Figure 3A:
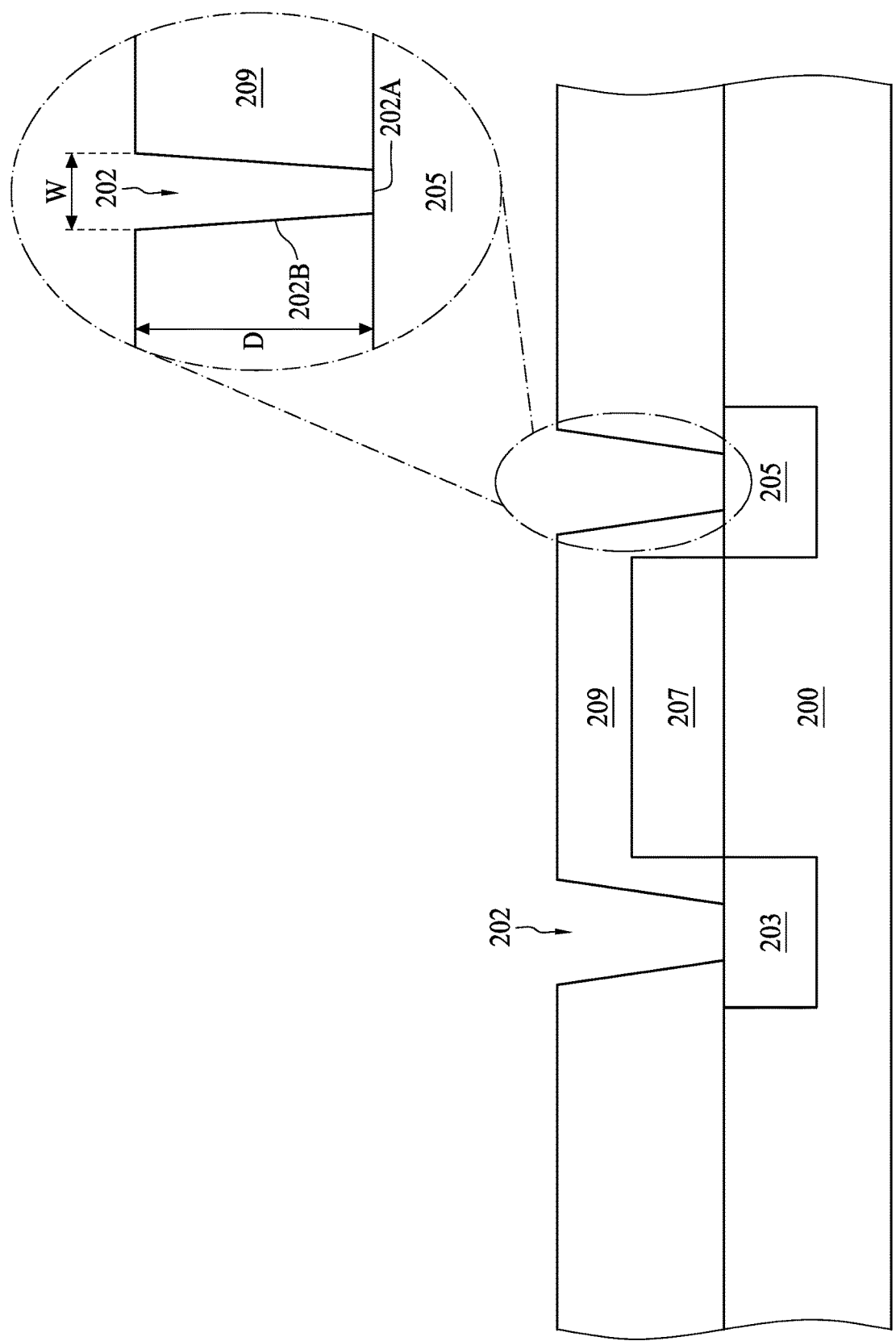
Figure 3B:
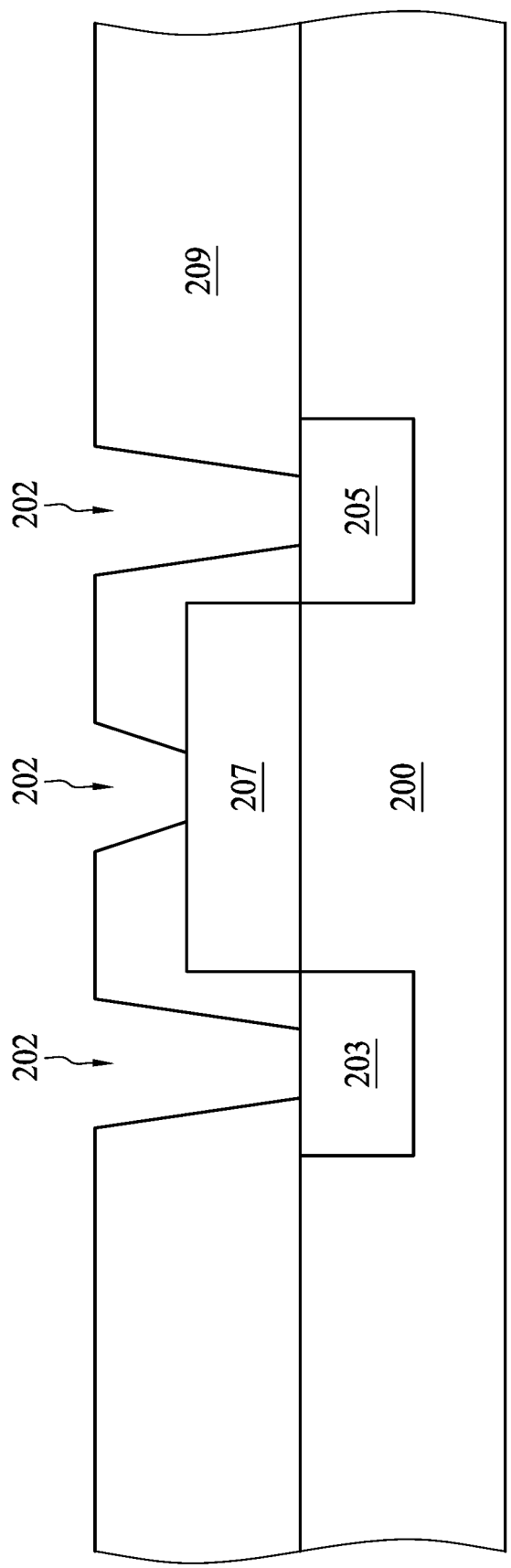

FIG. 2, FIG. 3A and FIG. 3B are cross-sectional views of a semiconductor structure fabricated at some stages, wherein FIGS. 4-7 are enlarged views of a trench of the semiconductor structure fabricated at one stage in accordance with some embodiments of the present disclosure. Referring to FIG. 2 and operation 101 in FIG. 1, a dielectric layer 209 is formed over a semiconductor substrate 200.

In some embodiment, the semiconductor substrate 200 is a silicon substrate. In other embodiments, the semiconductor substrate 200 may include other semiconductor materials, such as silicon germanium, silicon carbide, gallium arsenide, or the like. The semiconductor substrate 200 may be a p-type semiconductor substrate (P-Substrate) or an n-type semiconductor substrate (N-Substrate).

A transistor structure 201 is formed on the semiconductor substrate 200. The transistor structure 201 includes a source 203, a drain 205, and a gate 207. In some embodiments, the gate 207 is positioned over a top surface of the semiconductor substrate 200 and between the source 203 and drain 205. In some embodiments, the source 203 and the drain 205 are doped semiconductor regions of the semiconductor substrate 200. The dielectric layer 209 is formed on the semiconductor substrate 200. In some embodiments, the dielectric layer 209 is an inter-layer dielectric (ILD). The dielectric layer 209 over the semiconductor substrate 200 may be formed from a variety of dielectric materials.

Referring to FIG. 3A and FIG. 3B and operation 102 in FIG. 1, a trench 202 is formed in the dielectric layer 209. In some embodiments, the trench 202 includes a bottom 202A and a sidewall 202B. The trench 202 may be a groove, an recess, a hole, or the like formed in the dielectric layer 209. In some embodiments, the bottom 202A of the trench 202 exposes the doped semiconductor region of the semiconductor substrate 200, and the sidewall 202B of the trench 202 exposes the dielectric layer 209. The trench 202 may expose a region of the underlying semiconductor substrate 200, such as, the source 203, drain 205, and/or the gate 207, or the like. This is merely examples and is not intended to be limiting.

Referring to FIG. 3A, in some embodiments, the trench 202 may be formed both on the source 203 and the drain 205. The bottom 202A of the trench 202 may expose a portion of the source 203 and a portion of the drain 205. Referring to FIG. 3B, in some other embodiments, the trench 202 may also be formed on the gate 207. The trench 202 may expose a portion of the gate 207, a portion of the source 203, and a portion of the drain 205.

Figure 4:
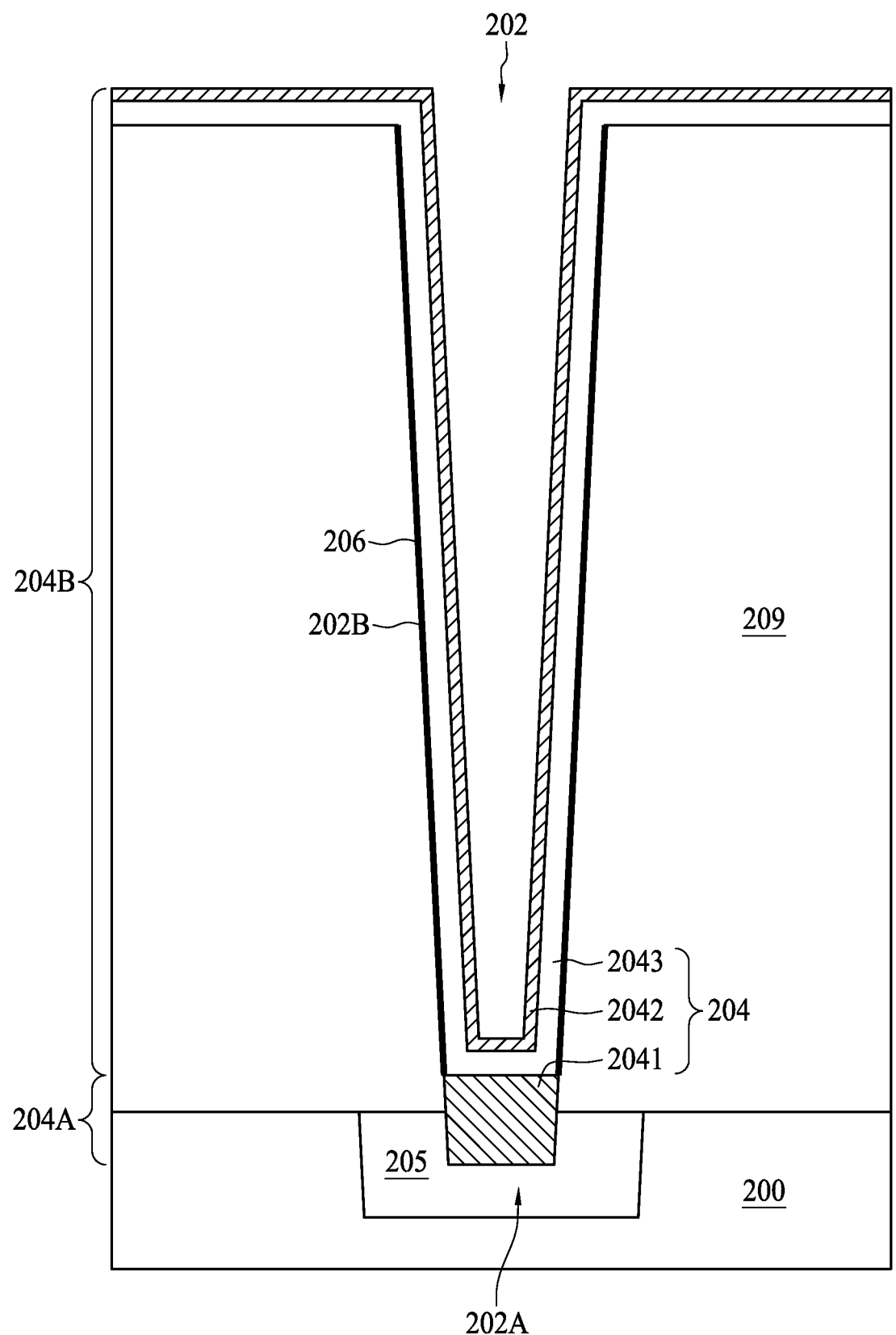
FIG. 4, FIG. 5, FIG. 6 and FIG. 7 are enlarged views of a trench of a semiconductor structure fabricated at one stage, in accordance with some embodiments of the present disclosure.

FIG. 4, FIG. 5, FIG. 6 and FIG. 7 are enlarged views of a trench of the semiconductor structure fabricated at one stage, in accordance with some embodiments of the present disclosure. Referring to FIG. 4 and operation 103 in FIG. 1, a conductive layer 204 is formed in the trench 202. The conductive layer 204 may include a liner conductive layer. The conductive layer 204 includes a first conductive portion 204A over the bottom 202A of the trench 202, and a second conductive portion 204B over the sidewall 202B of the trench 202. In some embodiments, a barrier layer 206 may be formed on the sidewall 202B of the trench 202. The barrier layer 206 is formed before the forming of the conductive layer 204. The barrier layer 206 may include oxide (e.g. silicon oxide), nitride (e.g. silicon nitride), or the like. The barrier layer 206 may be a single-layer structure or a multi-layer structure. The barrier layer 206 may be a single oxide layer structure or a single nitride layer structure. In some other embodiments, the barrier layer 206 may be a multi-layer structure with a combination of oxide layer(s) and nitride layer(s). In some embodiments, the barrier layer 206 over the sidewall 202B of the trench 202 is in contact with the dielectric layer 209. A portion of the semiconductor substrate 200, such as the doped semiconductor region, is still exposed, as shown in FIG. 4.

In some embodiments, the conductive layer 204 may include a multi-layered liner conductive layer. In some embodiments, the conductive layer 204 may include a silicide layer 2041, a liner capping layer 2042 and a metal layer 2043. In some embodiments, the metal layer 2043, which may include tungsten (W), cobalt (Co), titanium (Ti), nickel (Ni), or the like, is formed. The metal layer 2043 may be further formed over the dielectric layer 209. In some embodiments, the metal layer 2043 may be deposited using a physical vapor deposition (PVD) operation, chemical vapor deposition (CVD) operation, atomic layer deposition (ALD) operation, or the like. The metal layer 2043 is formed over the doped semiconductor region.

The silicide layer 2041 may be formed by diffusing the metal layer 2043 into upper portions of semiconductor substrate 200. In some embodiments, an annealing operation may be performed, and a portion of the metal layer 2043 may be diffused into and reacted with the semiconductor substrate 200 to form the silicide layer 2041. In some embodiments, after the diffusion, a portion of the metal layer 2043 may remain distinguishable from the silicide layer 2041. In some other embodiments, after the diffusion, the portion of the metal layer 2043 may be indistinguishable from the silicide layer 2041. The silicide layer 2041 may increase the conductivity of affected areas of semiconductor substrate 200.

In one or more embodiments, the dielectric layer 209 exposed through the sidewall 202B of the trench 202 is isolated from the second conductive portion 204B by the barrier layer 206. With the barrier layer 206, the second conductive portion 204B of the conductive layer 204 may not be diffused into the dielectric layer 209. Therefore, the second conductive portion 204B on the sidewall 202B of trench 202 may remain unreacted. On the sidewall 202B of trench 202, the second conductive portion 204B and the barrier layer 206 may be distinguishable.

Still referring to FIG. 4, the liner capping layer 2042 may include a metal nitride. In some embodiments, the liner capping layer 2042 may include titanium nitride (TiN), tantalum nitride (TaN), or the like. This is merely examples and is not intended to be limiting. In some embodiments, the liner capping layer 2042 may be deposited on the metal layer 2043 after the forming of the silicide layer 2041. The liner capping layer 2042 may be used as a protection layer for the silicide layer 2041. The liner capping layer 2042 may help to prevent the silicide layer 2041 from oxidization during the operations. In those embodiments, a thickness of the conductive layer 204 is a sum of a thickness of the metal layer 2043 and a thickness of the liner capping layer 2042, but the disclosure is not limited thereto.

In some embodiments, the liner capping layer 2042 may be formed by performing a nitridization. For example, nitrogen is introduced to nitridize the metal layer 2043 or the silicide layer 2041. Consequently, the liner capping layer 2042 is formed. In those embodiments, a thickness of the conductive layer 204 is substantially similar to a thickness of the metal layer 2043, but the disclosure is not limited thereto.

In some embodiments, the silicide layer 2041, the portion of the metal layer 2043 and a portion of the liner capping layer 2042 over the bottom 202A of the trench 202 may be taken as the first conductive portion 204A. The other portion of the metal layer 2043 and the other portion 2042 of the liner capping layer 2042 over the sidewall 202B of the trench 202 may be taken as the second conductive portion 204B.

Figure 5:
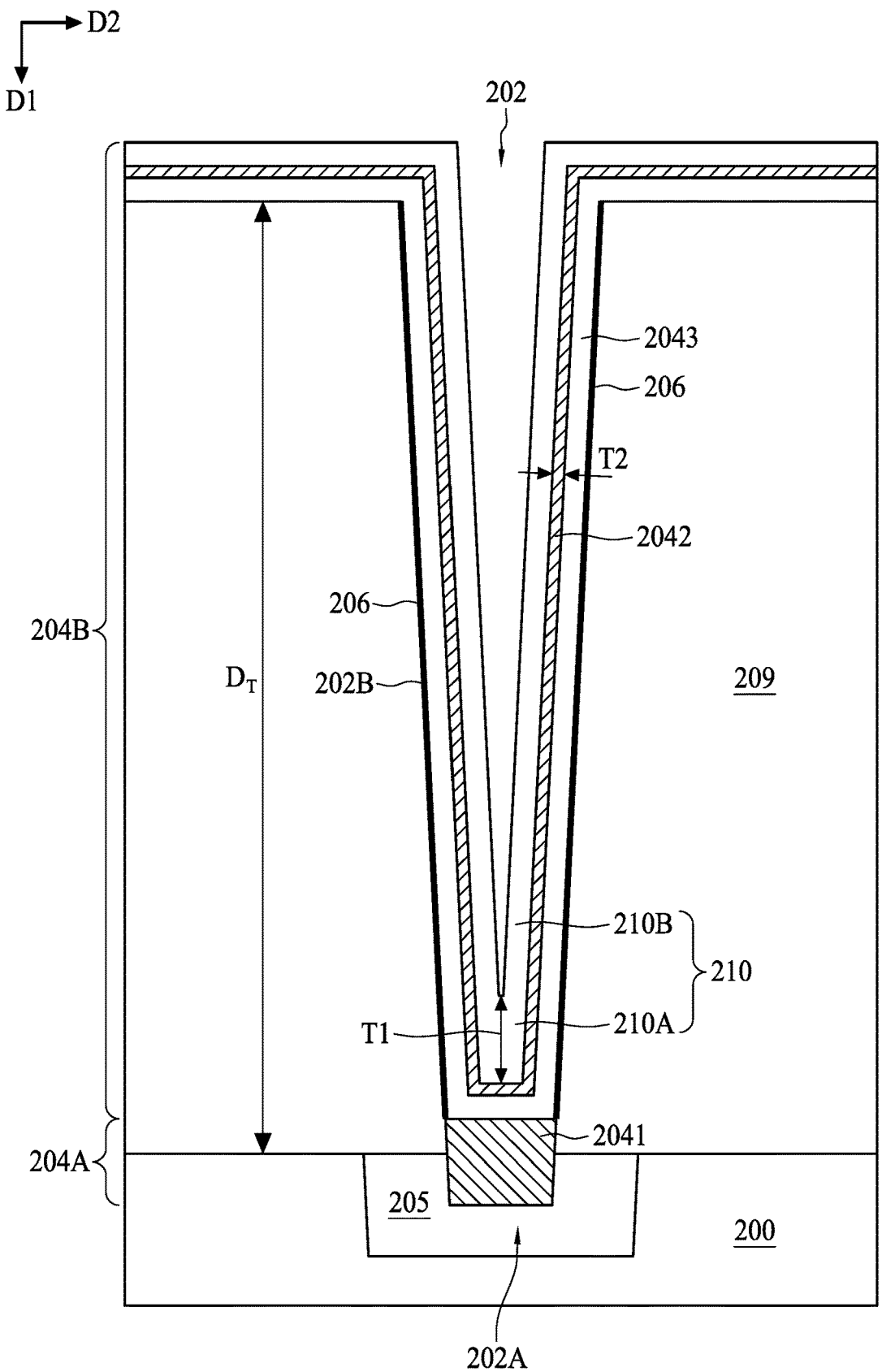

Referring to FIG. 5 and operation 104 in FIG. 1, a sacrificial layer 210 is formed over the conductive layer 204. The sacrificial layer 210 may include a liner sacrificial layer. The sacrificial layer 210 includes a first sacrificial portion 210A over the first conductive portion 204A, and a second sacrificial portion 210B over the second conductive portion 204B. The first sacrificial portion 210A has a first thickness T1 measured along a first direction D1 substantially parallel to a depth direction $D_T$ of the trench 202. The second sacrificial portion 210B has a second thickness T2 of measured along a second direction D2 substantially perpendicular to the depth direction $D_T$ of the trench 202. The first thickness T1 is larger than the second thickness T2. In some embodiments, a ratio (T1/T2) of the first thickness T1 to the second thickness T2 may be, but is not limited to, greater than or equal to 4.

Figure 8:
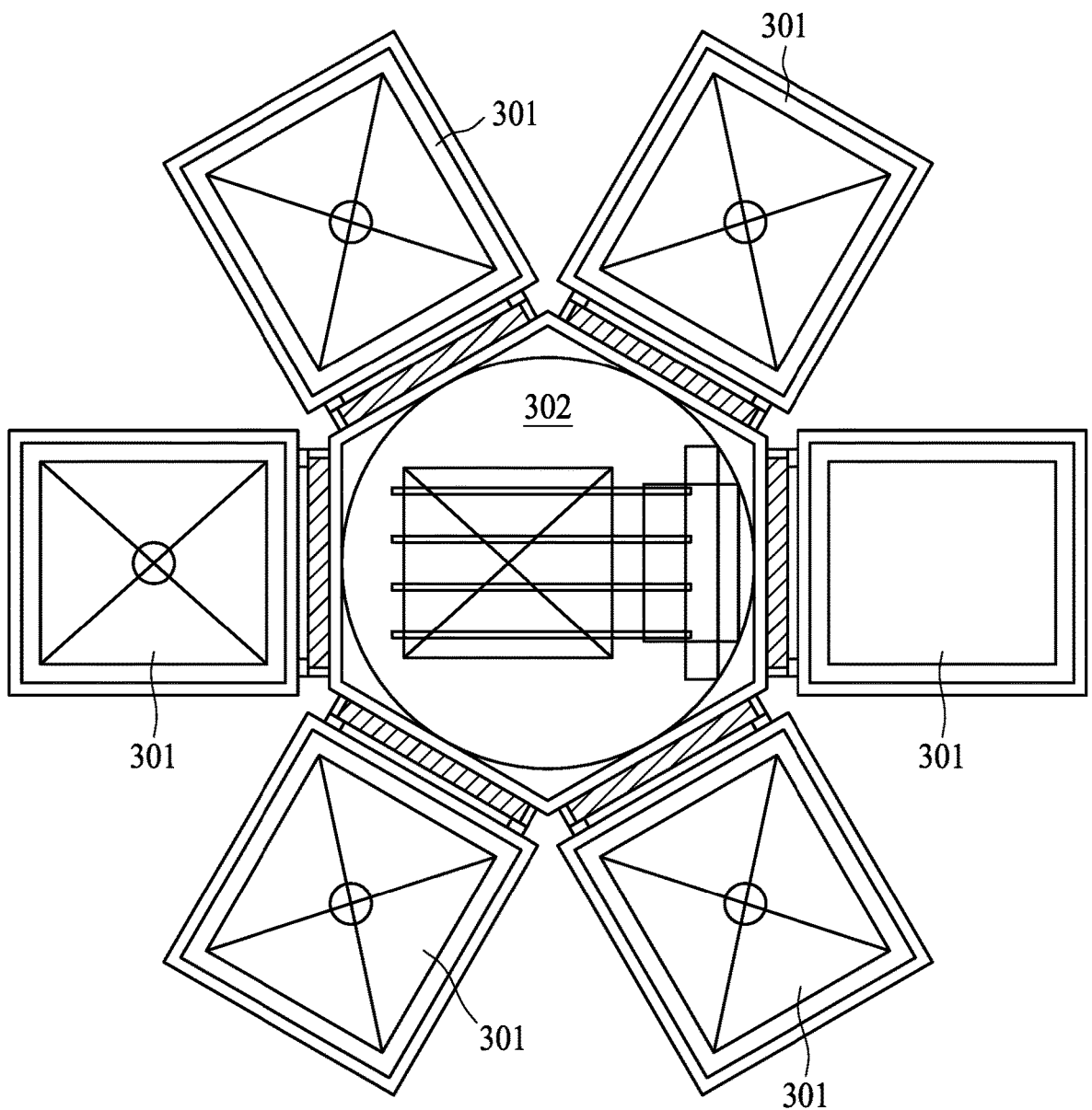
FIG. 8 is a plan view of a PVD system configured for PVD operation, in accordance with some embodiments of the present disclosure.
Figure 9:
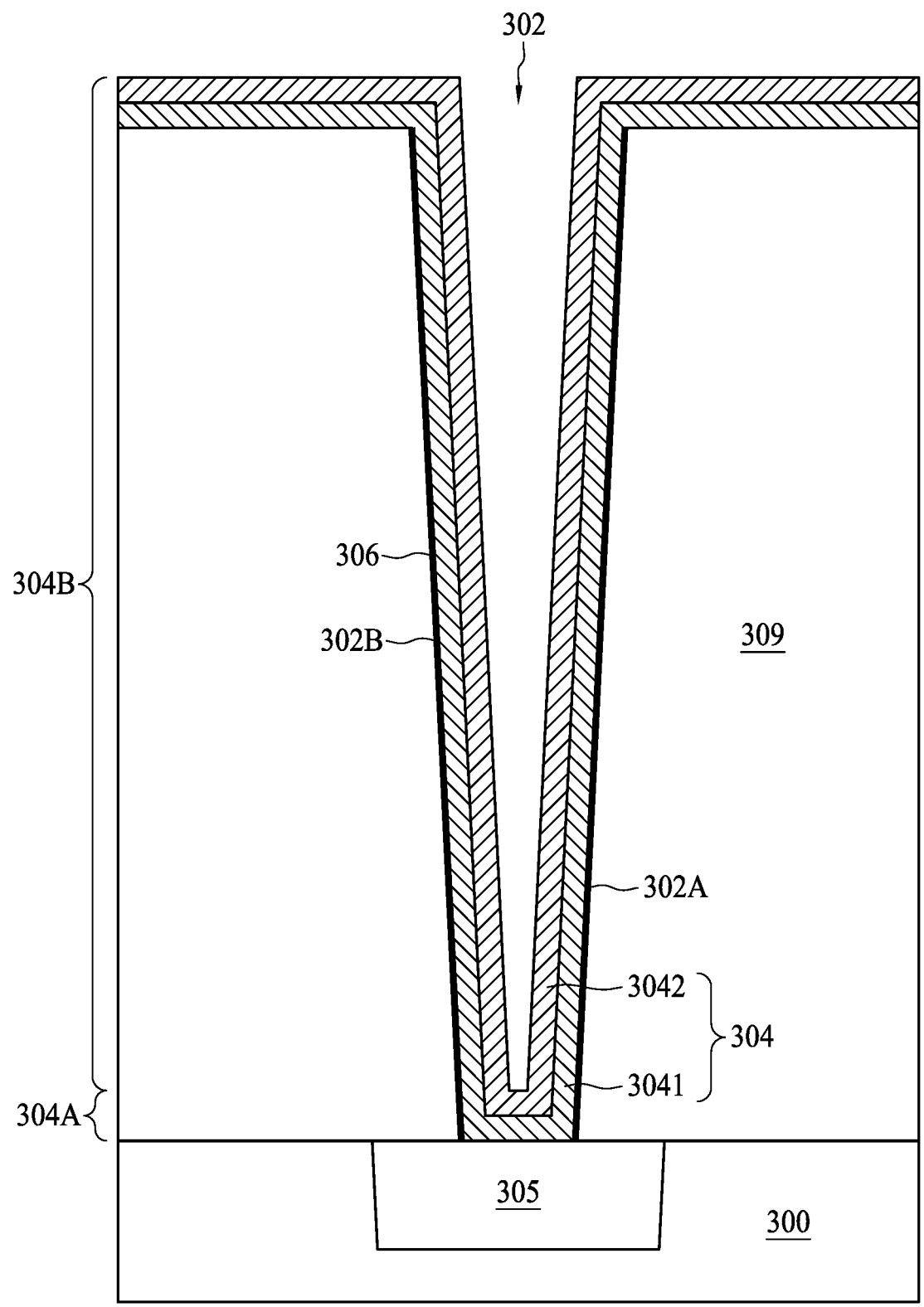
FIG. 9, FIG. 10, FIG. 11 and FIG. 12 are enlarged views of a trench of a semiconductor structure fabricated at some stages, in accordance with some embodiments of the present disclosure.

The sacrificial layer 210 may include a metal oxide layer. In some embodiments, the sacrificial layer 210 is formed by PVD operation. FIG. 8 is a plan view of an PVD system configured for PVD operation, in accordance with some embodiments of the present disclosure. Referring to FIG. 5 and FIG. 8, in some embodiments, a metal layer may be formed over the conductive layer 204 in a PVD chamber 301. In one or more embodiments, the metal layer formed by PVD operation may have the feature of the thickness on the bottom 202A (related to first thickness T1) is larger than the thickness on the sidewall 202B (related to second thickness T2). The metal layer is exposed to an oxygen-containing environment, such as the transfer chamber 302. In one or more embodiments, the sacrificial layer 210 is formed in an in-situ manner by PVD operation. For example, the transfer chamber 302 may contain oxygen and thus the metal layer may be oxidized during transferring the semiconductor substrate 200 to different chamber, and the metal oxide layer as the sacrificial layer 210 is formed.

Figure 6:
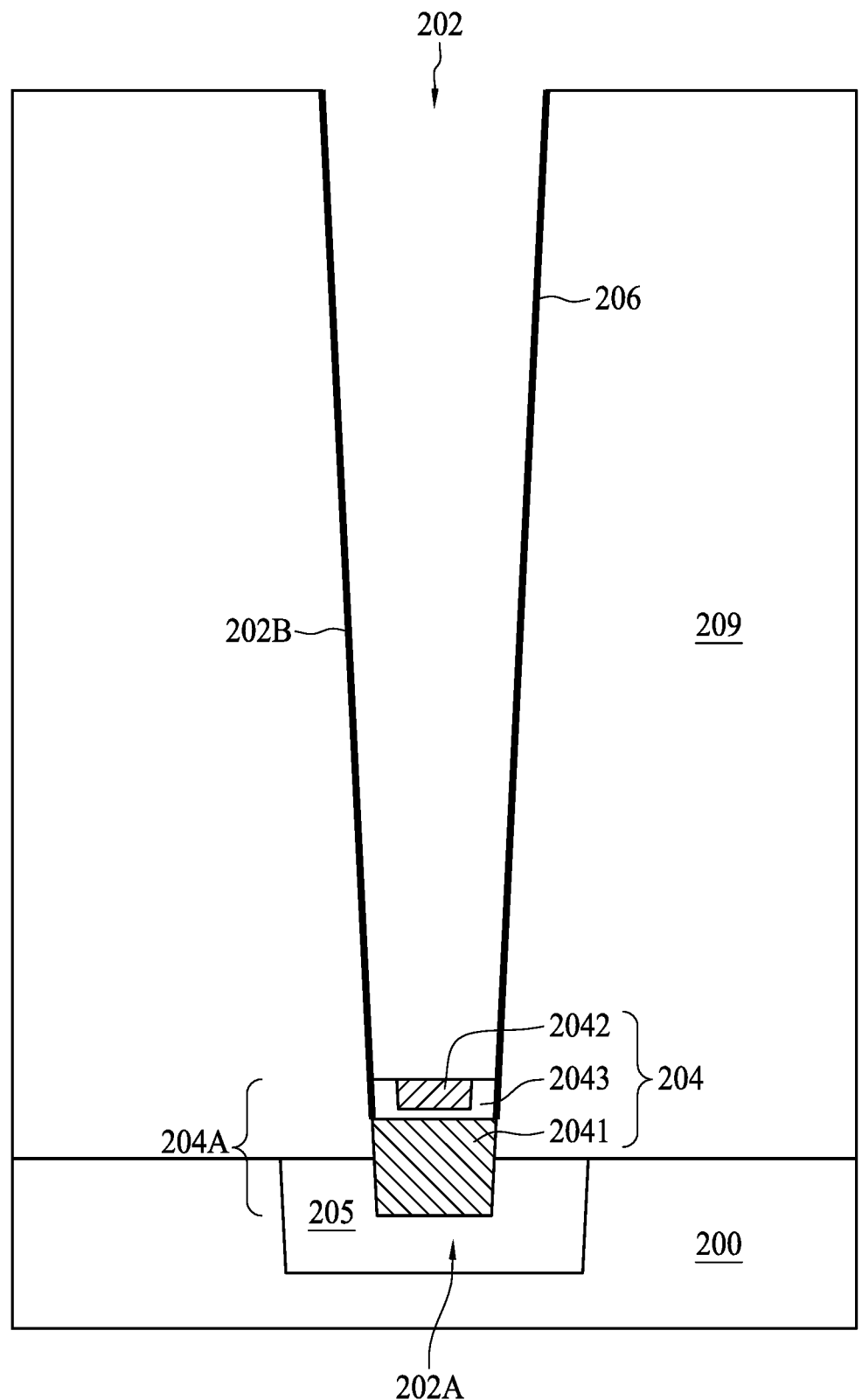

Referring to FIG. 5 and FIG. 6, and operation 105 in FIG. 1, the first sacrificial portion 210A and the second sacrificial portion 210B of the sacrificial layer 210, and the second conductive portion 204B of the conductive layer 204 are removed. At least a portion of the first conductive portion 204A remains over the bottom 202A of the trench 202. In some embodiments, the remaining portion of the first conductive portion 202A may include a portion of the silicide layer 2041, a portion of the metal layer 2043 and a portion of the liner capping layer 2042.

In some embodiments, the first sacrificial portion 210A and the second sacrificial portion 210B of the sacrificial layer 210, and the second conductive portion 204B of conductive layer 204 are removed in an in-situ manner. In some embodiments, the first sacrificial portion 210A and the second sacrificial portion 210B of the sacrificial layer 210, and the second conductive portion 204B of the conductive layer 204 are removed by the same etching operation. In some embodiments, the etching operation includes a wet etching operation, but is not limited thereto.

Referring to FIG. 6, the removing operation of the sacrificial layer 210 is ended when the first sacrificial portion 210A is removed. In one or more embodiments, the thickness T1 of the first sacrificial portion 210A (on the bottom 202A) is larger than the total thickness of the second sacrificial portion 210B and the second conductive portion 204B (on the sidewall 202B). With the thickness difference, the second sacrificial portion 210B and the second conductive portion 204B are removed when the first sacrificial portion 210A is removed. In some other embodiments, with the thickness difference, the second sacrificial portion 210B and the second conductive portion 204B on the sidewall 202B of the trench 202 may be removed before the first sacrificial portion 210A is removed. In some embodiments, a trench corner rounding (TCR) operation may be performed in the subsequent operation depending on the need of the semiconductor structure.

Briefly, the second portion 204B of the conductive layer 204 (e.g. the metal layer 2043 and the liner capping layer 2042 over the sidewall 202B of the trench 202) may be removed with the second sacrificial portion 210B of the sacrificial layer 210. The profile kink issue of the conductive layer 204 near the bottom 202A of the trench 202 or the damage to the conductive layer 204 (e.g. the silicide layer 2041 on the bottom 202A) may be alleviated.

Figure 7:
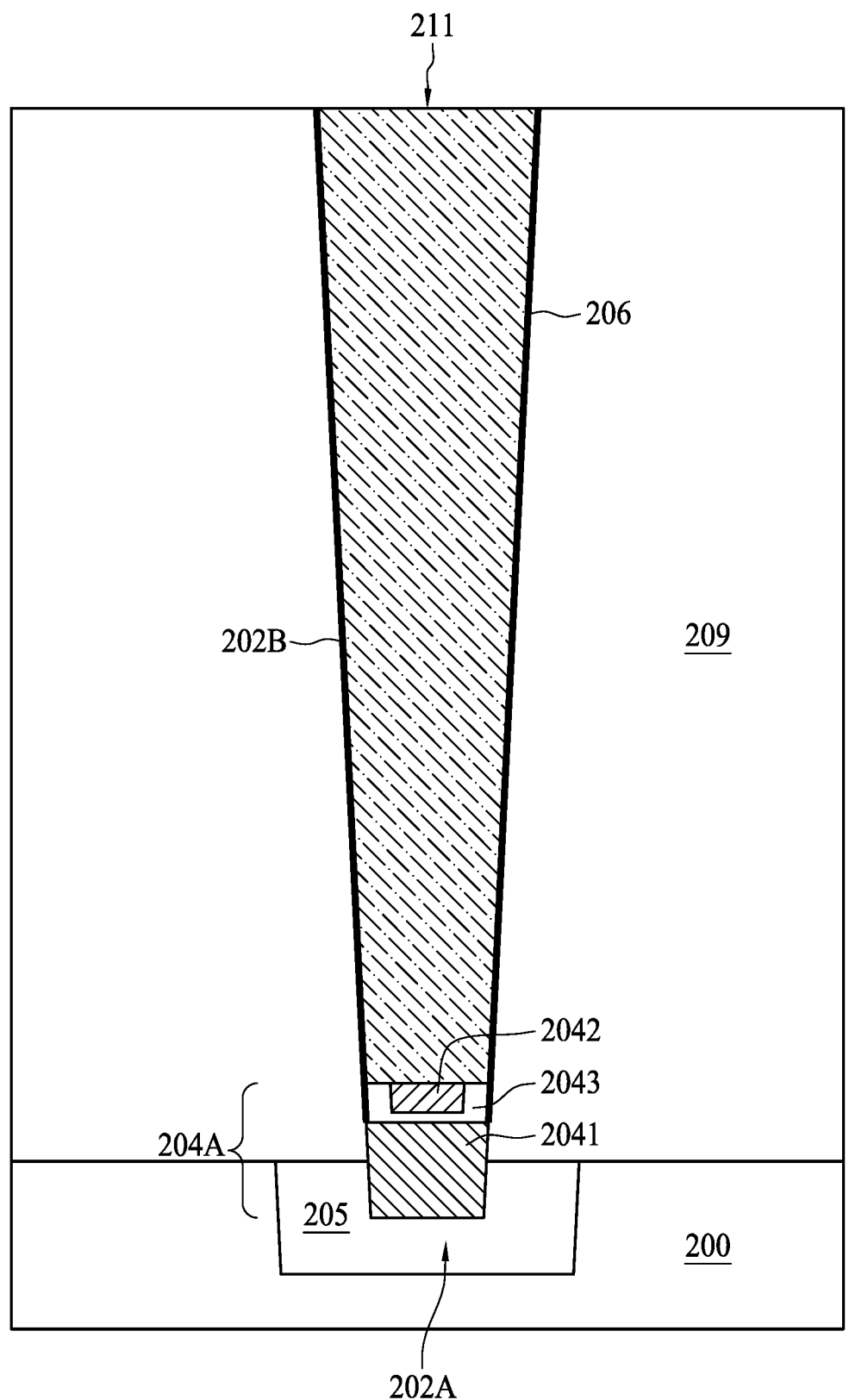

Referring to FIG. 7, in some embodiments, a conductive via 211 is formed in the trench 202 after the removing the first sacrificial portion 210A and the second sacrificial portion 210B of the sacrificial layer 210, and the second conductive portion 204B of the conductive layer 204. The conductive via 211 is electrically coupled to the drain 205 (or/and the source 203 in FIG. 2) through the first conductive portion 204A of the conductive layer 204. The remaining first conductive portion 204A (including the over the bottom 202A and the silicide region 204C) is used as a contact area for the conductive via 211.

In some embodiments of the present disclosure, the sacrificial layer 210 may help to remove the second conductive portion 204B of the conductive layer 204 near the bottom 202A of the trench 202. In one or more embodiments, the profile kink issue of the conductive layer 204 near the bottom 202A of the trench 202 or the damage to the conductive layer 204 on the bottom 202A of the trench 202 due to heavy etch operation may be alleviated. Further, in some embodiments of the present disclosure, the conductive via gap-fill opening may be enlarged and the volume decreasing of the low-resistivity conductive via may be alleviated. Moreover, in one or more embodiments, performing the PVD operation to form the metal oxide layer as the sacrificial layer 210 in an in-situ manner may increase the manufacturing efficiency.

FIG. 9, FIG. 10, FIG. 11 and FIG. 12 are enlarged views of a trench of a semiconductor structure fabricated at one stage, in accordance with some embodiments of the present disclosure. Further, similar elements in FIGS. 9-12 and FIGS. 2-7 can include similar materials; therefore, repetitive details are omitted in the interest of brevity. In some embodiments, a dielectric layer 309 is formed on a semiconductor substrate 300 in operation 101. As mentioned above, a device such as a transistor device may be formed on the semiconductor substrate 300. A trench 302 is formed in the dielectric layer 309 in operation 102. The trench 302 includes a bottom 302A exposing a portion of the semiconductor substrate 300, such as a doped semiconductor region 305. The trench 302 includes a sidewall 302B exposing the dielectric layer 309. A barrier layer 306 may be formed over the sidewall 302B of the trench 302. However, the doped semiconductor region 305 may be exposed through the barrier layer 306. A conductive layer 304 is formed in the trench 302 in operation 103. Referring to FIG. 10A, in some embodiments, the conductive layer 304 may include a multi-layered liner conductive layer. The conductive layer 304 may include a silicide layer 3041 over the trench 302 and a capping layer 3042 over the silicide layer 3041. The silicide layer 3041 may include a liner silicide layer. The capping layer 3042 may include a liner capping layer. In some embodiments, a portion of the liner silicide layer 3041 and a portion of the liner capping layer 3042 on the bottom 302A of the trench 302 may be taken as a first conductive portion 304A, while other portions of the liner silicide layer 3041 and other portion of the liner capping layer 3042 over the sidewall 302B of the trench 302 may be taken as a second conductive portion 304B.

In some embodiments, the liner silicide layer 3041 may include a metal silicide. The liner silicide layer 3041 may include tungsten silicide, cobalt silicide, titanium silicide, nickel silicide, or the like. This is merely examples and is not intended to be limiting. In some embodiments, the liner silicide layer 3041 may be formed by CVD, but the disclosure is not limited thereto. The liner capping layer 3042 may include a metal nitride. In some embodiments, the liner capping layer 3042 may include titanium nitride, tantalum nitride, or the like. This is merely examples and is not intended to be limiting. The liner capping layer 3042 may be used as a protection layer for the liner silicide layer 3041. The liner capping layer 3042 may help to prevent the liner silicide layer 3041 from oxidization during the operations.

Figure 10:
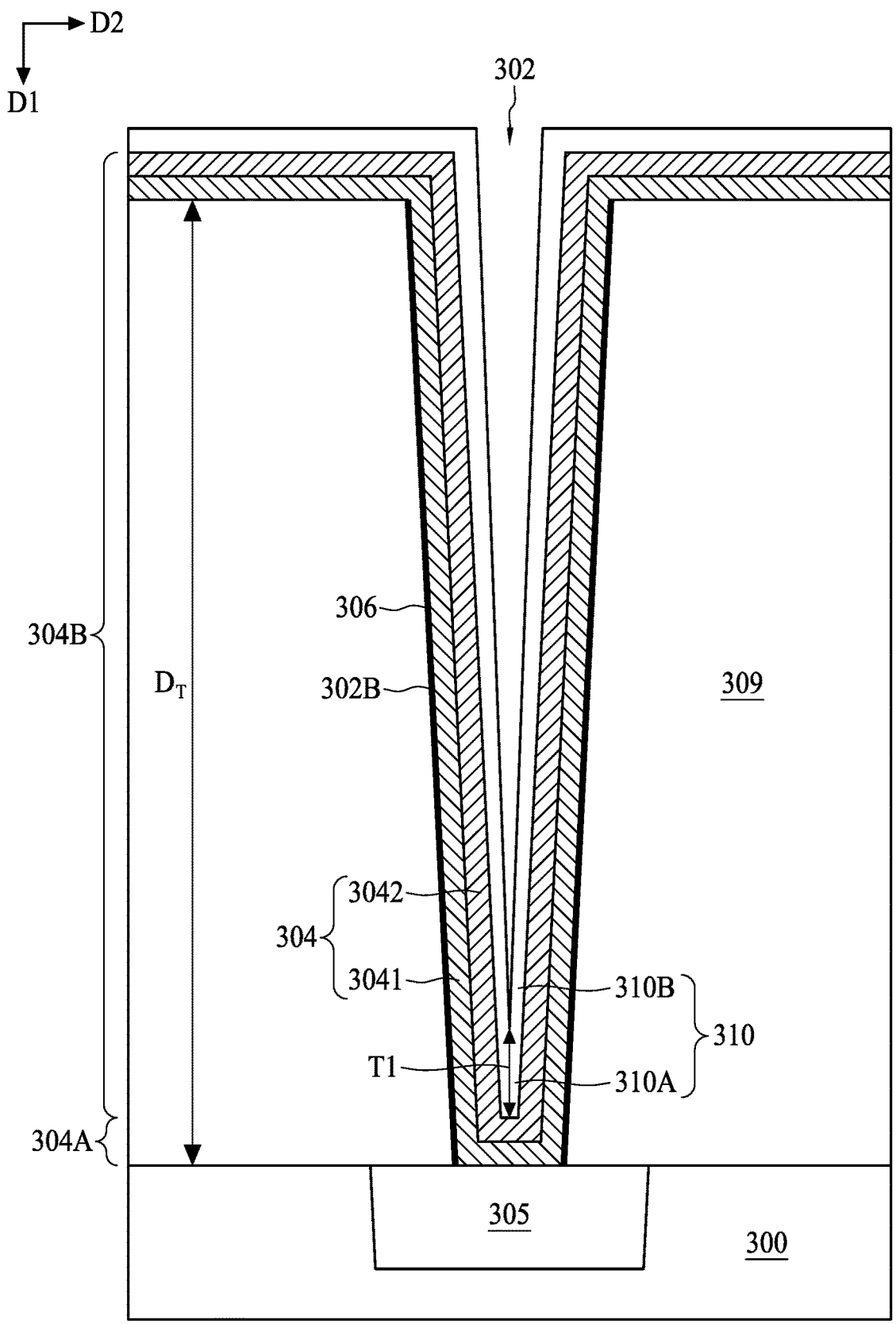

Referring to FIG. 10, a sacrificial layer 310 is formed on the conductive layer 304 in operation 104. The sacrificial layer 310 includes a first sacrificial portion 310A over the first conductive portion 304A, and a second sacrificial portion 310B over the second conductive portion 304B. The first sacrificial portion 310A has a first thickness T1 measured along a first direction D1 substantially parallel to a depth direction $D_T$ of the trench 302. The second sacrificial portion 310B has a second thickness T2 of measured along a second direction D2 substantially perpendicular to the depth direction $D_T$ of the trench 302. The first thickness T1 is larger than the second thickness T2. In some embodiments, a ratio (T1/T2) of the first thickness T1 to the second thickness T2 may be, but is not limited to, greater than or equal to 4.

Figure 11:
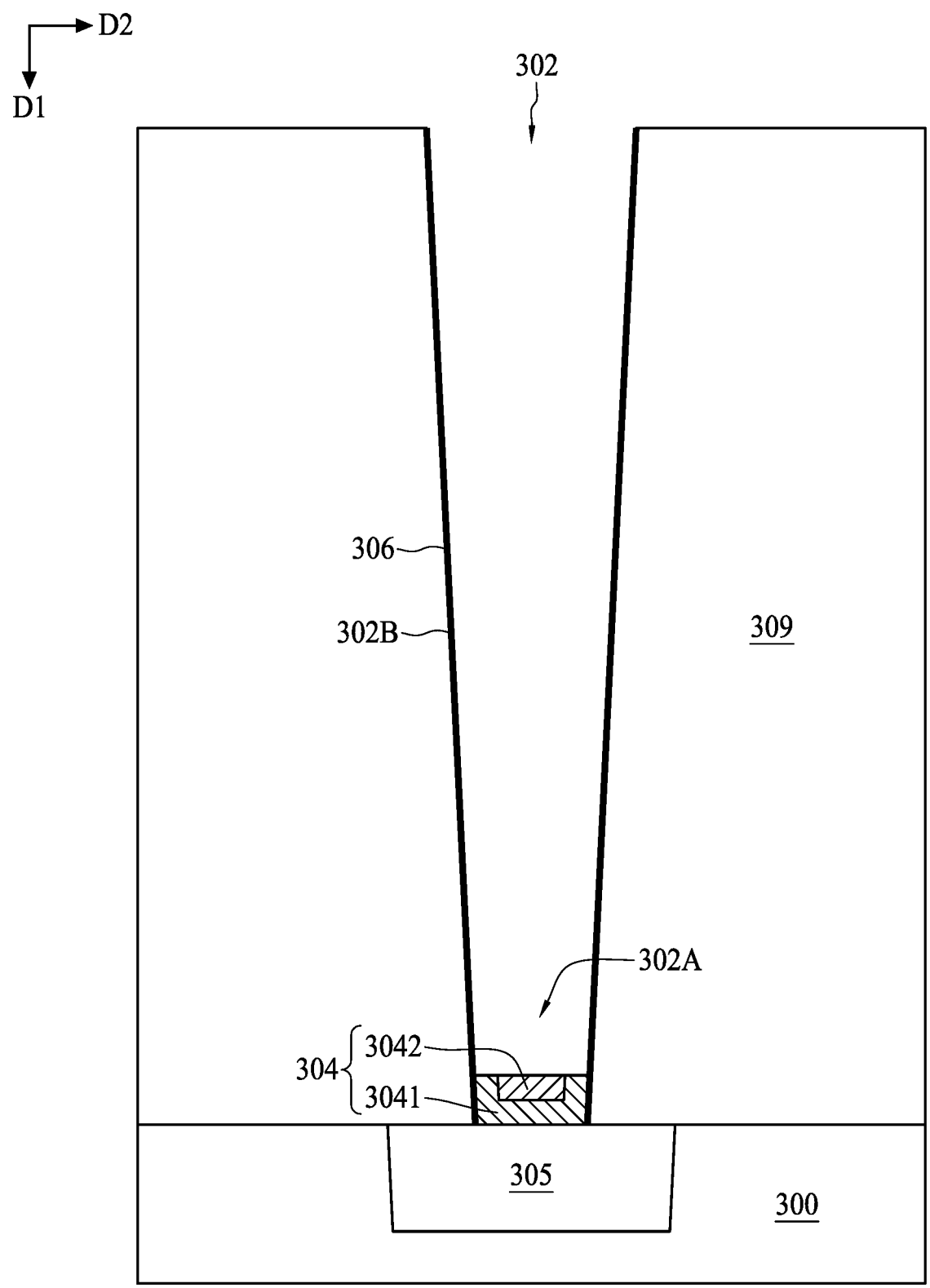

Referring to FIG. 11, the second conductive portion 304B of the conductive layer 304 on the sidewall 302B of the trench 302 is removed with the sacrificial layer 310 in operation 105. The detailed description of how the second conductive portion 304B of the conductive layer 304 is removed with the sacrificial layer 310 is similar to FIG. 6 described above and omitted here for brevity. In some embodiments, the first conductive portion 304A (including a portion of the liner silicide layer 3041 and a portion of the liner capping layer 3402) are remaining over the bottom 302A of the trench 302.

Figure 12:
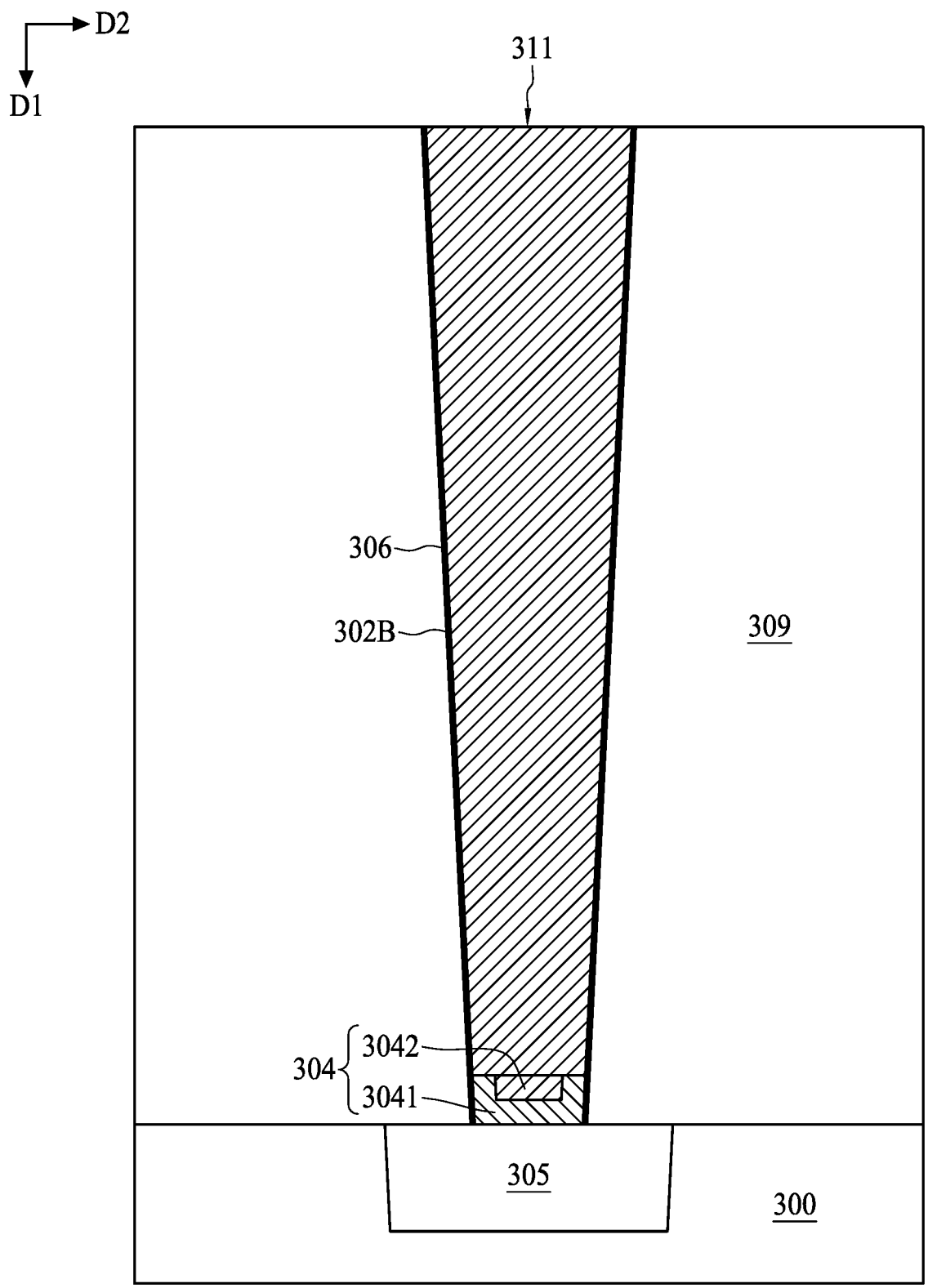

Referring to FIG. 12, the conductive via 311 is then formed on the conductive layer 304, the remaining first conductive portion 304A of the conductive layer 304 over the semiconductor substrate 300 may include the liner silicide layer 3041 and the liner capping layer 3042. In some embodiments, the liner capping layer 3042 on the bottom 302A may remain unremoved and act as a glue layer for the conductive via 311.

Figure 13:
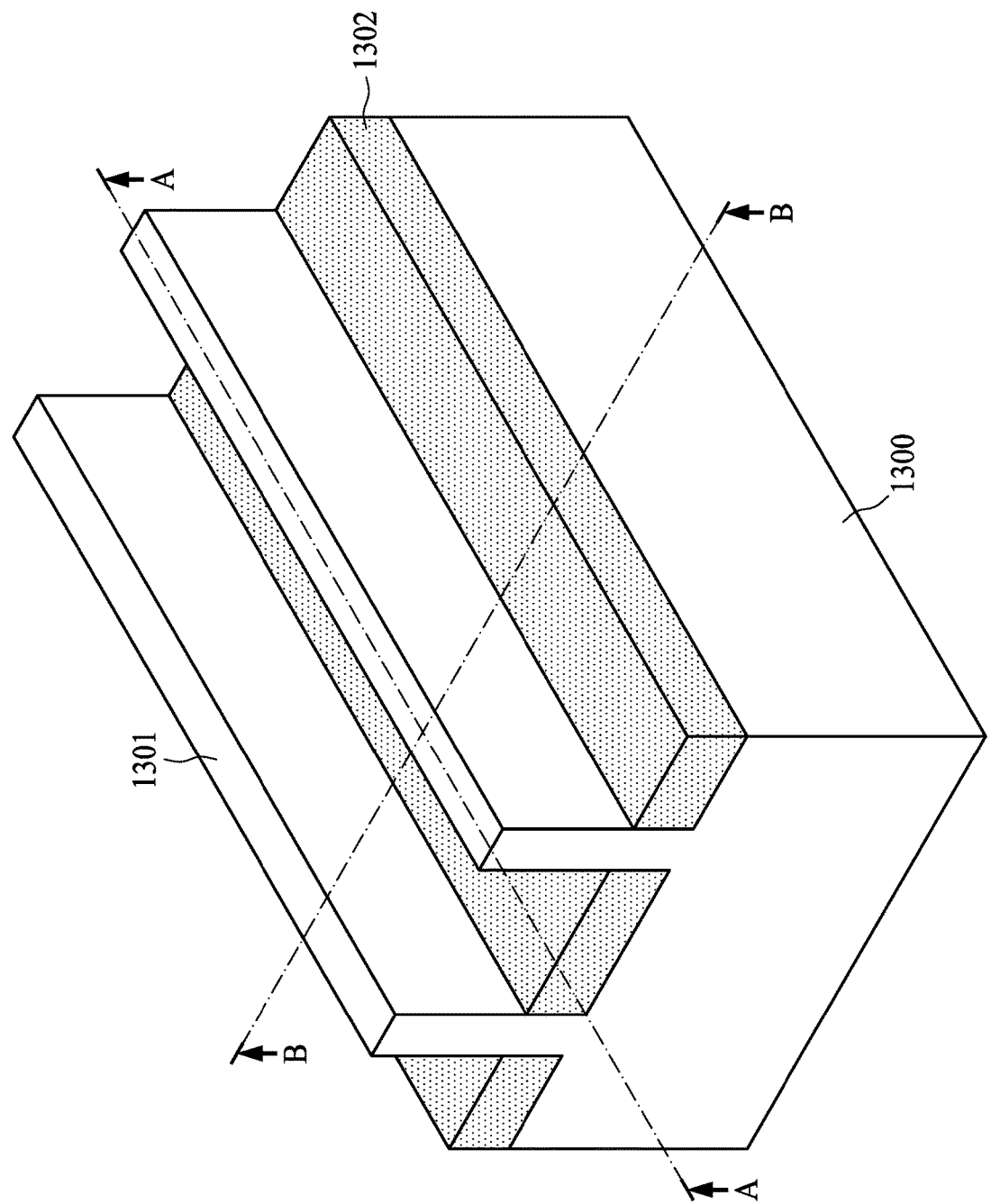
FIG. 13 is a perspective view of a semiconductor structure fabricated at some stages, in accordance with some embodiments of the present disclosure.

FIG. 13 is a perspective view of a semiconductor structure fabricated at some stages, in accordance with some embodiments of the present disclosure. In some embodiments, the semiconductor structure includes a fin structure. The fin structure may be formed by a series of operations, and here is omitted for brevity. In some embodiments, a plurality of fin regions 1301 and an oxide layer 1302 are formed on the semiconductor substrate 1300.

In some embodiments, a gate structure is formed on the fin regions 1301. The operations of forming the gate structure are discussed in detail below using the cross-sectional views along line A-A and line B-B.

Figure 14A:
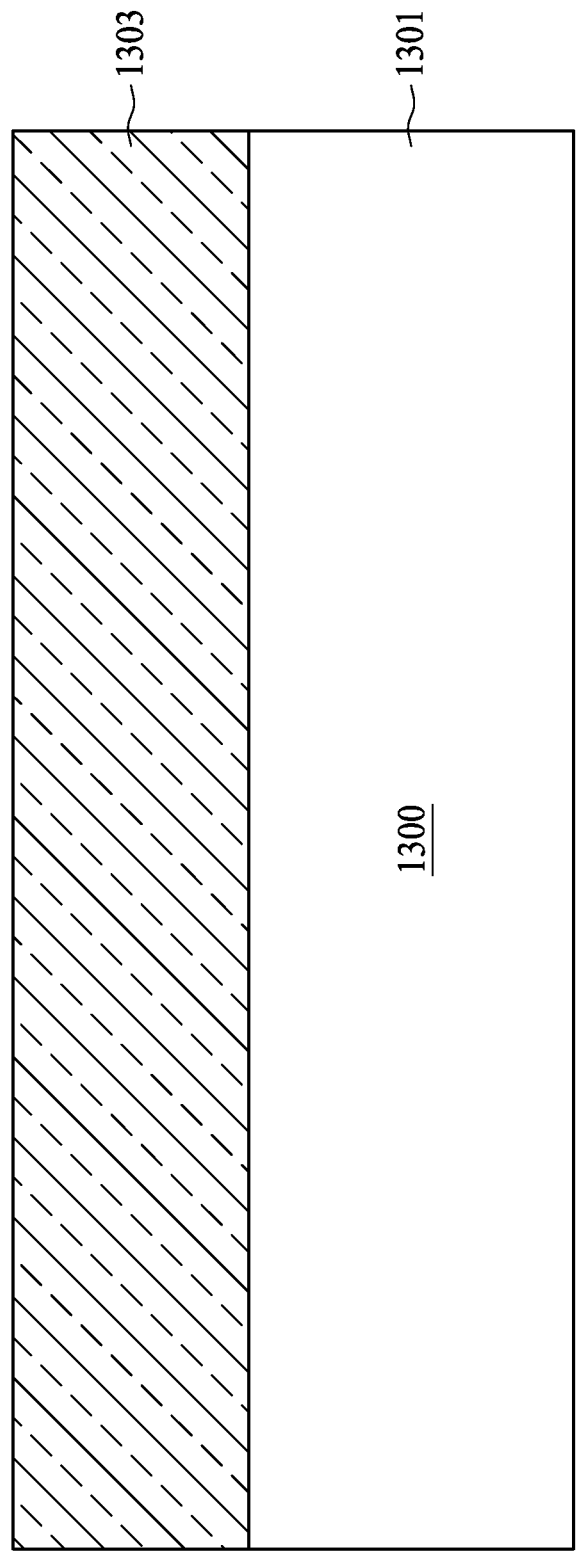
FIG. 14A is a cross-sectional view of a semiconductor structure fabricated at some stages along the line A-A in FIG. 13, in accordance with some embodiments of the present disclosure.
Figure 14B:
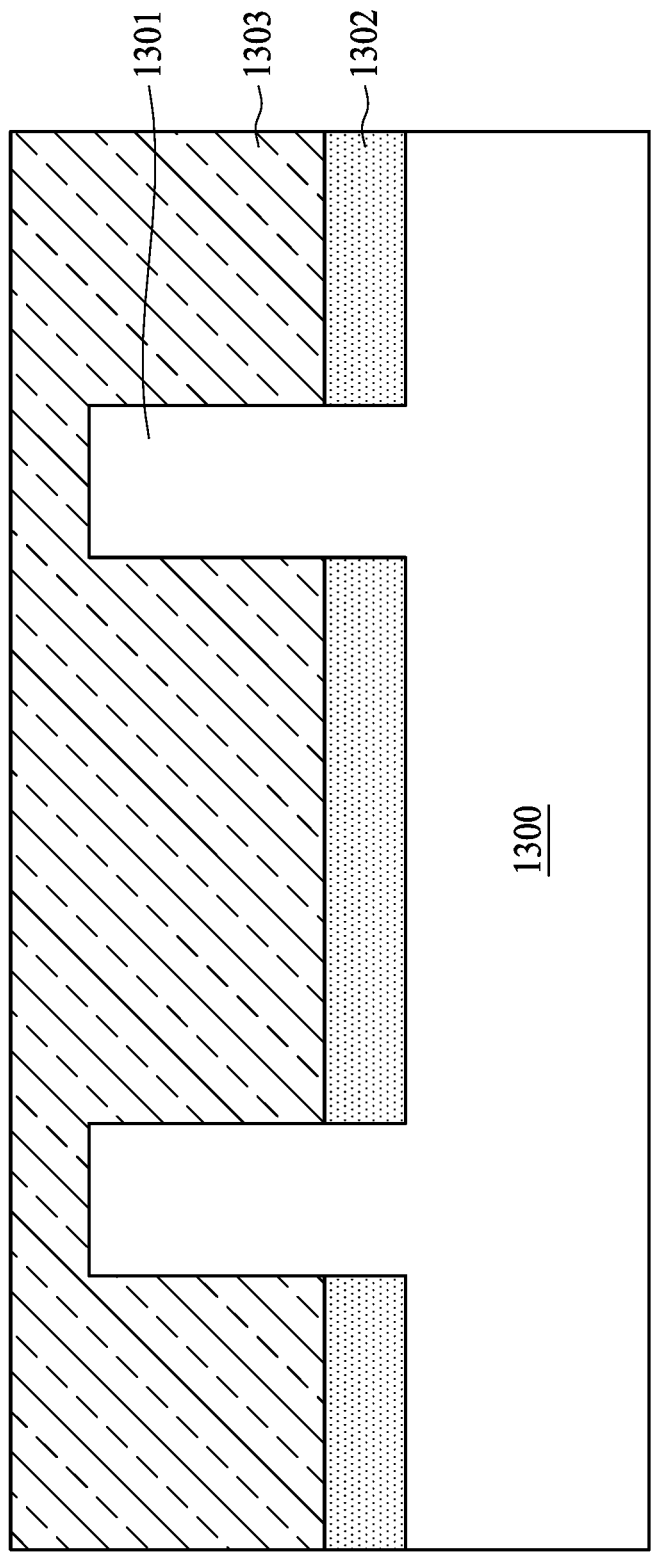
FIG. 14B is a cross-sectional view of a semiconductor structure fabricated at some stages along the line B-B in FIG. 13, in accordance with some embodiments of the present disclosure.

FIG. 14A is a cross-sectional view of a semiconductor structure fabricated at some stages along the line A-A in FIG. 13, in accordance with some embodiments of the present disclosure. FIG. 14B is a cross-sectional view of a semiconductor structure fabricated at some stages along the line B-B in FIG. 13, in accordance with some embodiments of the present disclosure. It is noted that the line A-A is along with fin region and the B-B line crosses the fin regions and does not include the gate structure formed in the subsequent operations.

Referring to FIG. 14A and FIG. 14B, a semiconductive layer 1303 is formed over the semiconductor substrate 1300. The semiconductive layer 1303 may include silicon (Si) such as poly silicon, or other suitable semiconductor materials.

Figure 15:
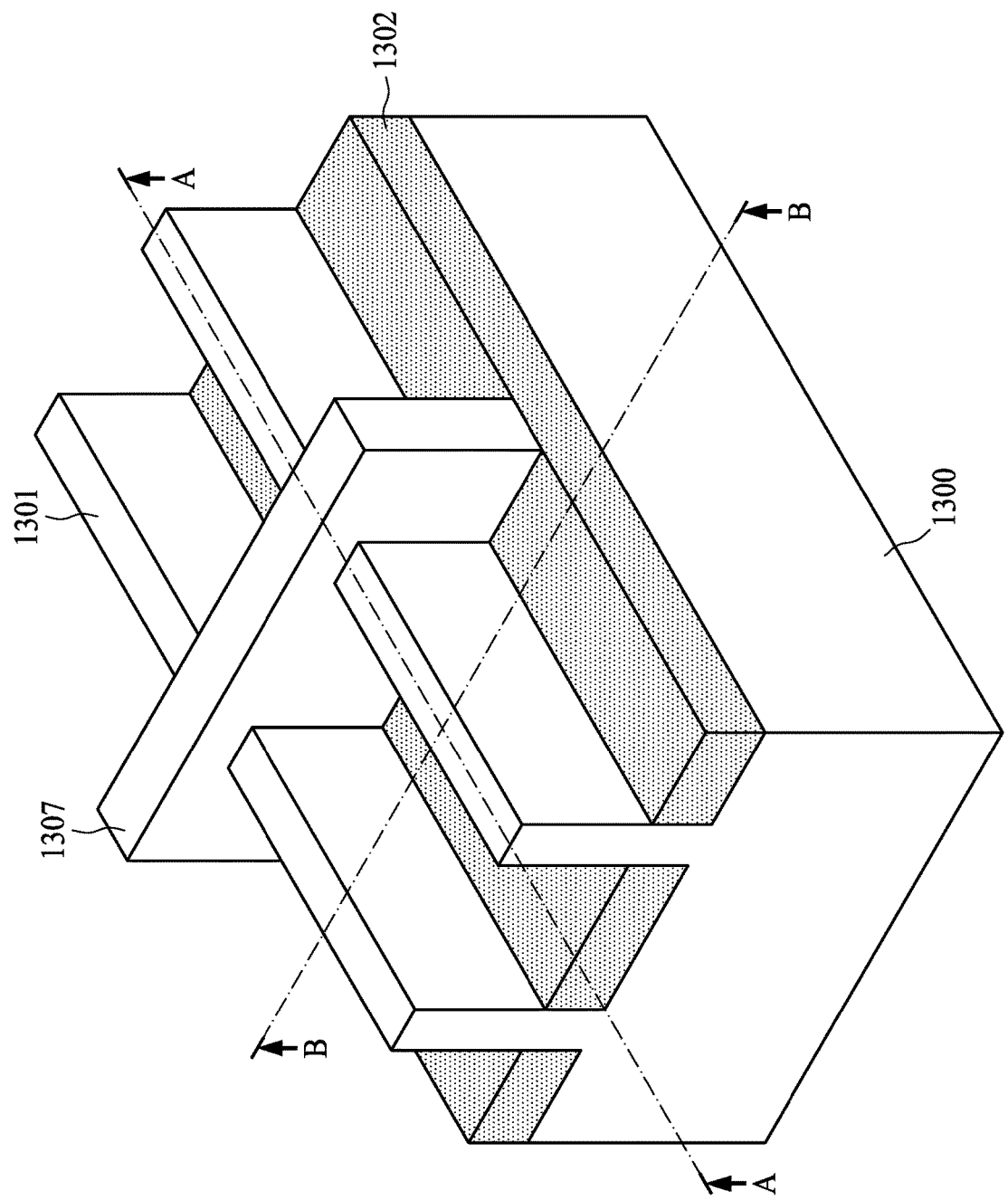
FIG. 15 is a perspective view of a semiconductor structure fabricated at some stages, in accordance with some embodiments of the present disclosure.

FIG. 15 is a perspective view of a semiconductor structure fabricated at some stages, in accordance with some embodiments of the present disclosure. FIG. 16A, FIG. 17A, FIG. 18A, FIG. 19A, FIG. 20A, FIG. 21A, and FIG. 22A are cross-sectional views of a semiconductor structure fabricated at some stages along the line A-A in FIG. 15, in accordance with some embodiments of the present disclosure. FIG. 16B, FIG. 17B, FIG. 18B, FIG. 21B and FIG. 22B are cross-sectional views of a semiconductor structure fabricated at some stages along the line B-B in FIG. 15, in accordance with some embodiments of the present disclosure.

Figure 16A:
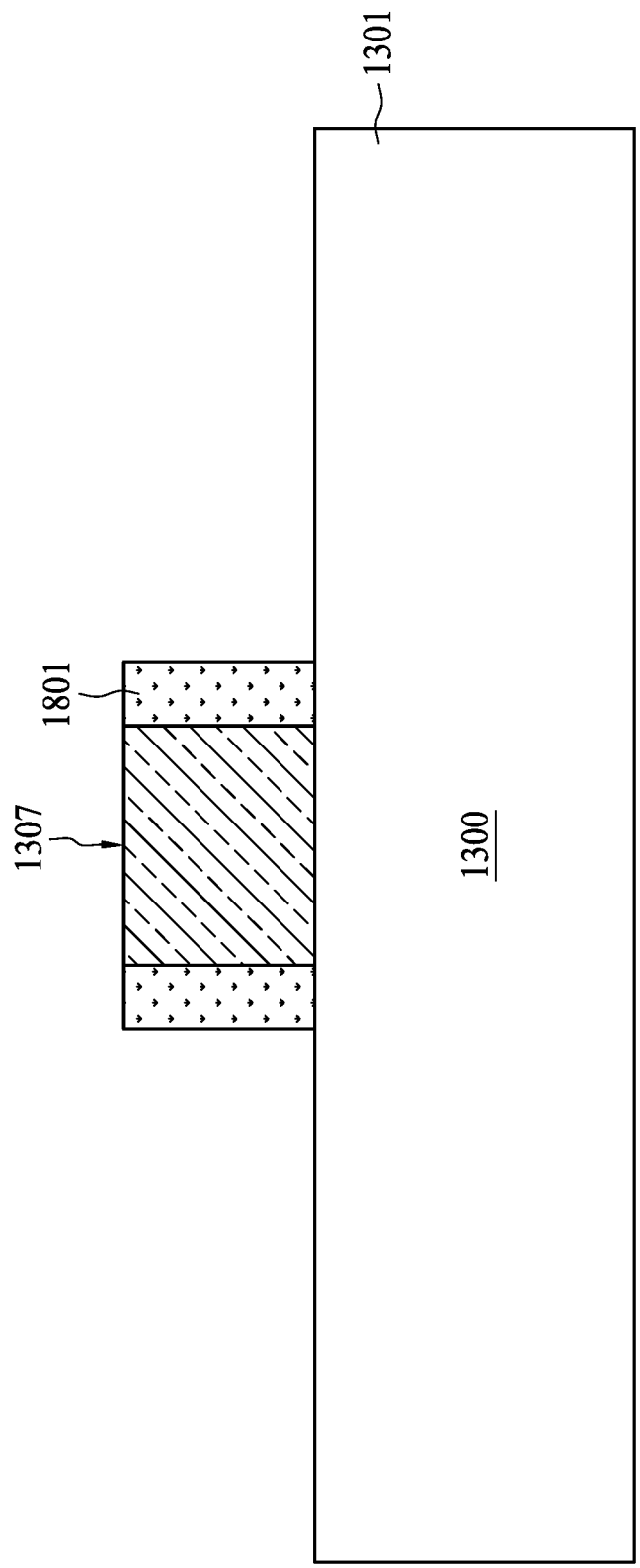
FIG. 16A, FIG. 17A, FIG. 18A, FIG. 19A, FIG. 20A, FIG. 21A, and FIG. 22A are cross-sectional views of a semiconductor structure fabricated at some stages along the line A-A in FIG. 15, in accordance with some embodiments of the present disclosure.
Figure 16B:
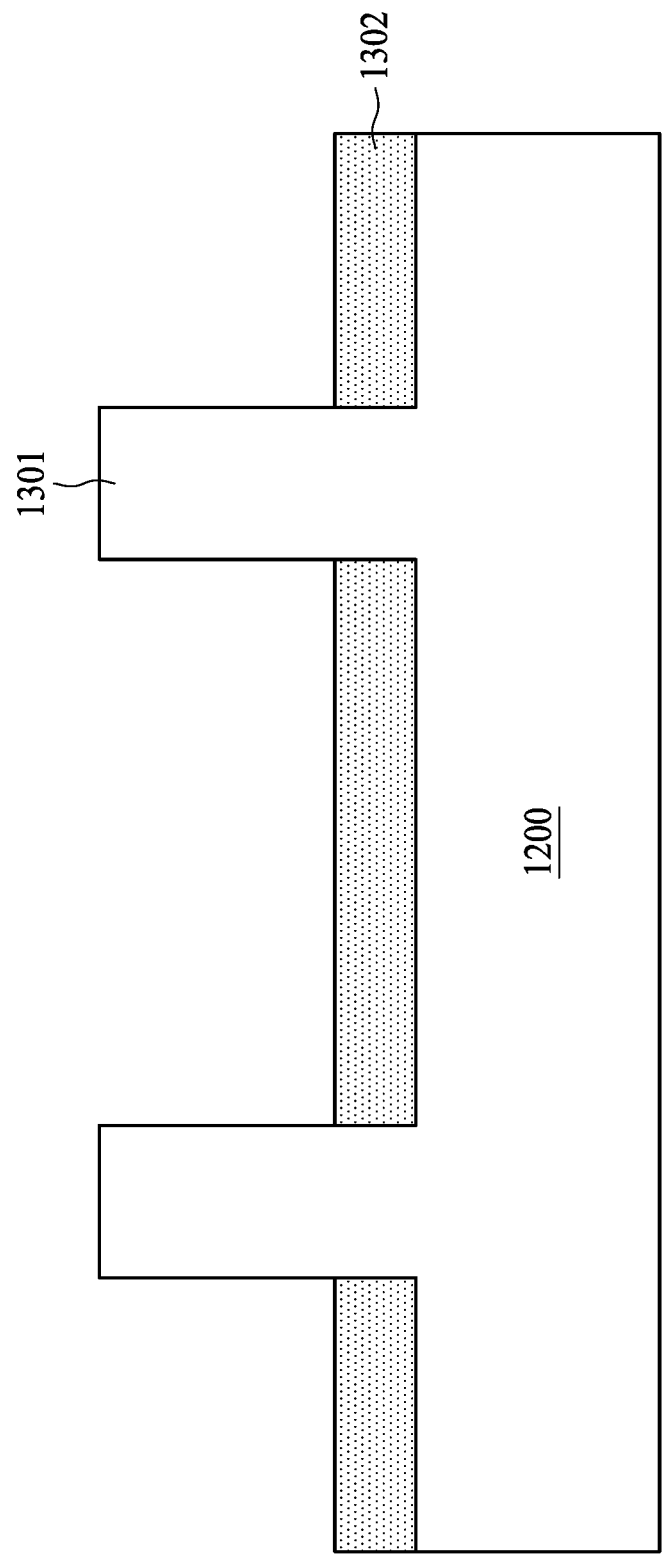
FIG. 16B, FIG. 17B, FIG. 18B, FIG. 21B, and FIG. 22B are cross-sectional views of a semiconductor structure fabricated at some stages along the line B-B in FIG. 15, in accordance with some embodiments of the present disclosure.

Referring to FIG. 15, FIG. 16A, and FIG. 16B, the semiconductor layer 1303 is patterned to form a dummy gate structure 1307 on the fin regions 1301. A portion of the fin regions 1301 are exposed from the semiconductive layers 1303 after the dummy gate structure 1307 is formed. In some embodiments, a spacer 1801 is formed on two opposite sides of the dummy gate structure 1307. The spacer 1801 may be made of dielectric material such as oxide, nitride or the like. The spacer 1801 may be single-layered or multi-layered.

Figure 17A:
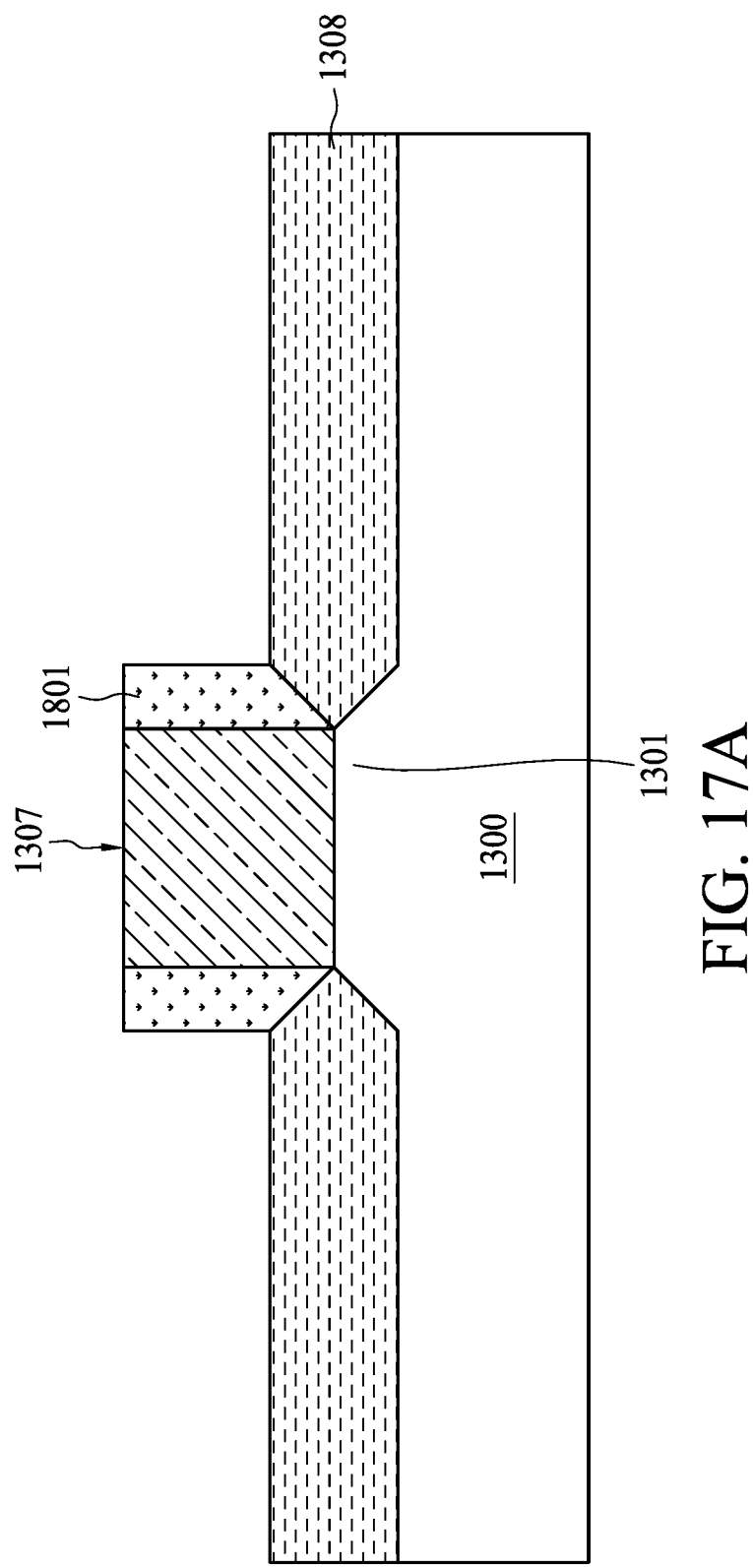
Figure 17B:
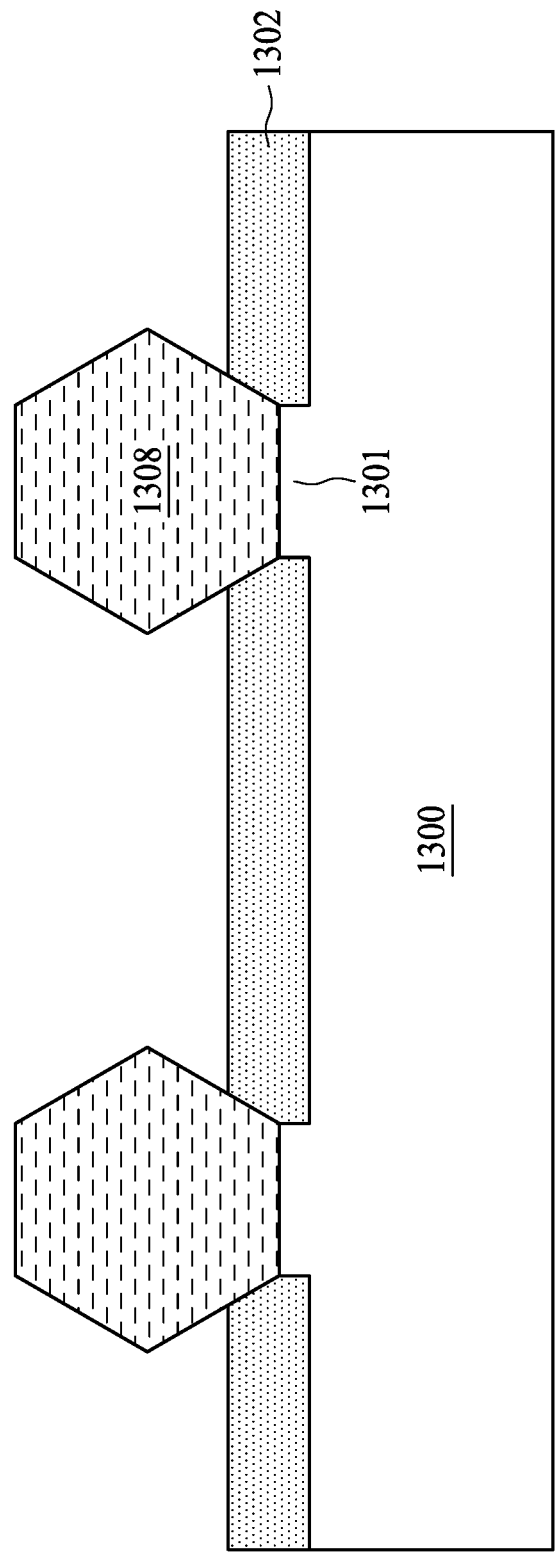

Referring to FIG. 17A and FIG. 17B, in some embodiments, the fin regions 1301 of semiconductor substrate 1300 uncovered by the patterned semiconductive layer 1307 and the spacer 1801 are partially removed. A recess may be formed on the fin regions 1301 and a semiconductor is deposited on the recess of the fin regions 1301 to form a pair of source/drain regions 1308. The source/drain regions 1308 may be deposited by epitaxial growth. In some embodiments, the material of the source/drain regions 1308 is such selected to have a larger or smaller lattice constant than the semiconductor of the channel region.

Figure 18A:
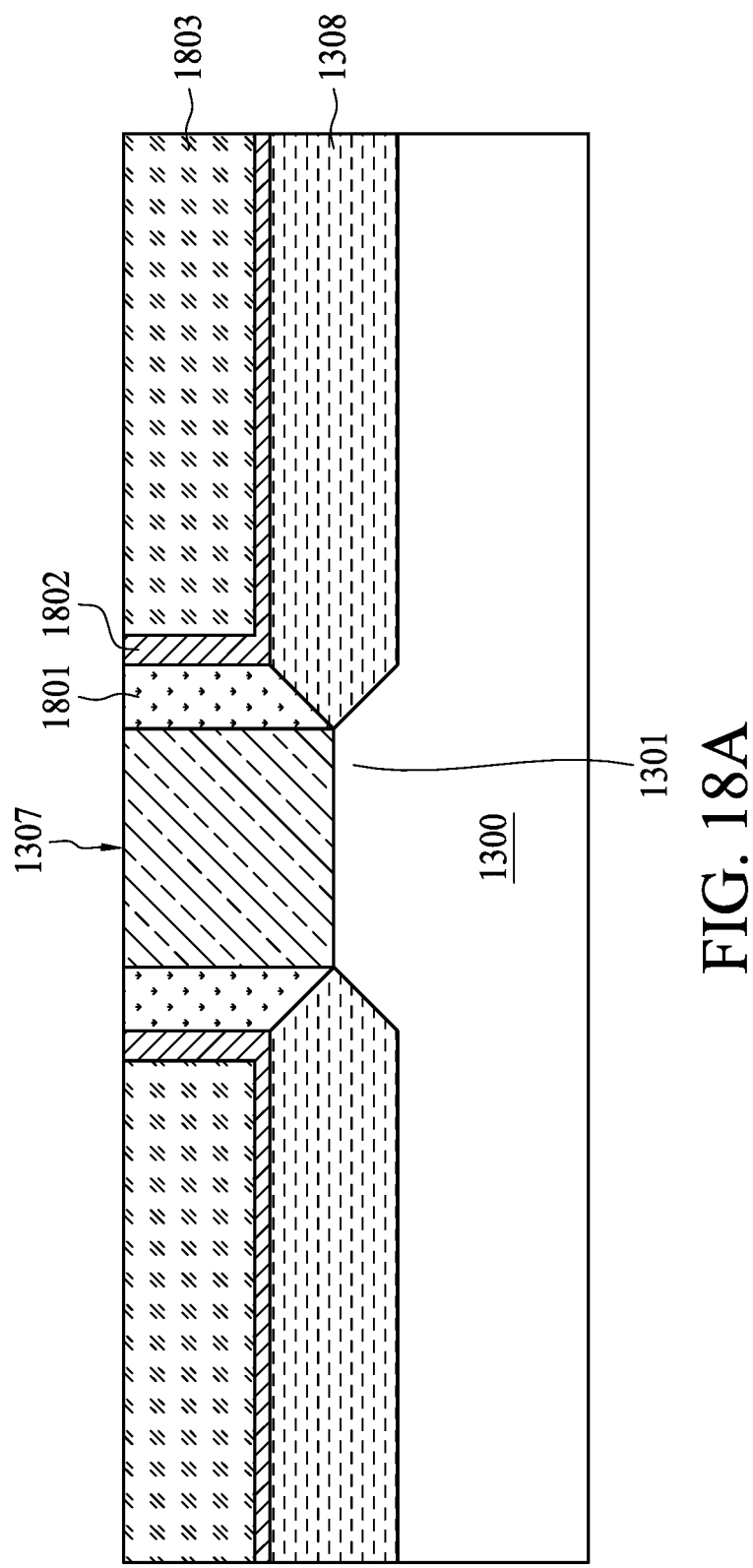
Figure 18B:
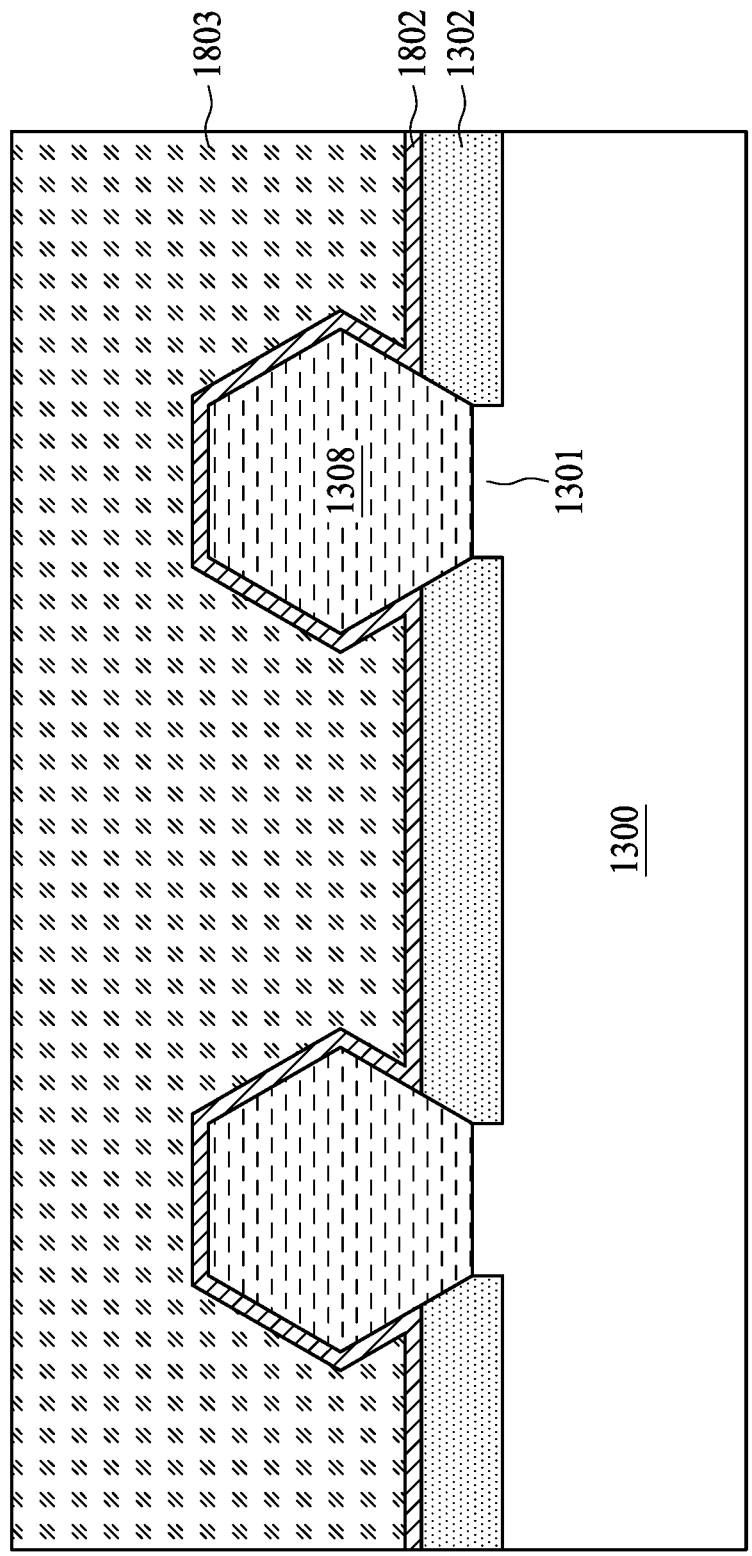

Referring to FIG. 18A and FIG. 18B, a contact etch stop layer (CESL) 1802 and a dielectric layer 1803 are formed. The CESL 1802 may be formed of silicon nitride (SiN), silicon oxynitride (SiON), and/or other suitable materials. The dielectric layer 1803 may be an inter-layer dielectric (ILD). The dielectric layer 1803 may include silicon oxide (SiOx), silicon oxynitride (SiON), or a low k material. These are, of course, merely examples and are not intended to be limiting. In some embodiments, there may be more intermediate layers formed in-between. The CESL 1802 and the dielectric layer 1803 may be partially removed, for example by a chemical mechanical polish (CMP) or the like, to expose the dummy gate structure.

Figure 19A:
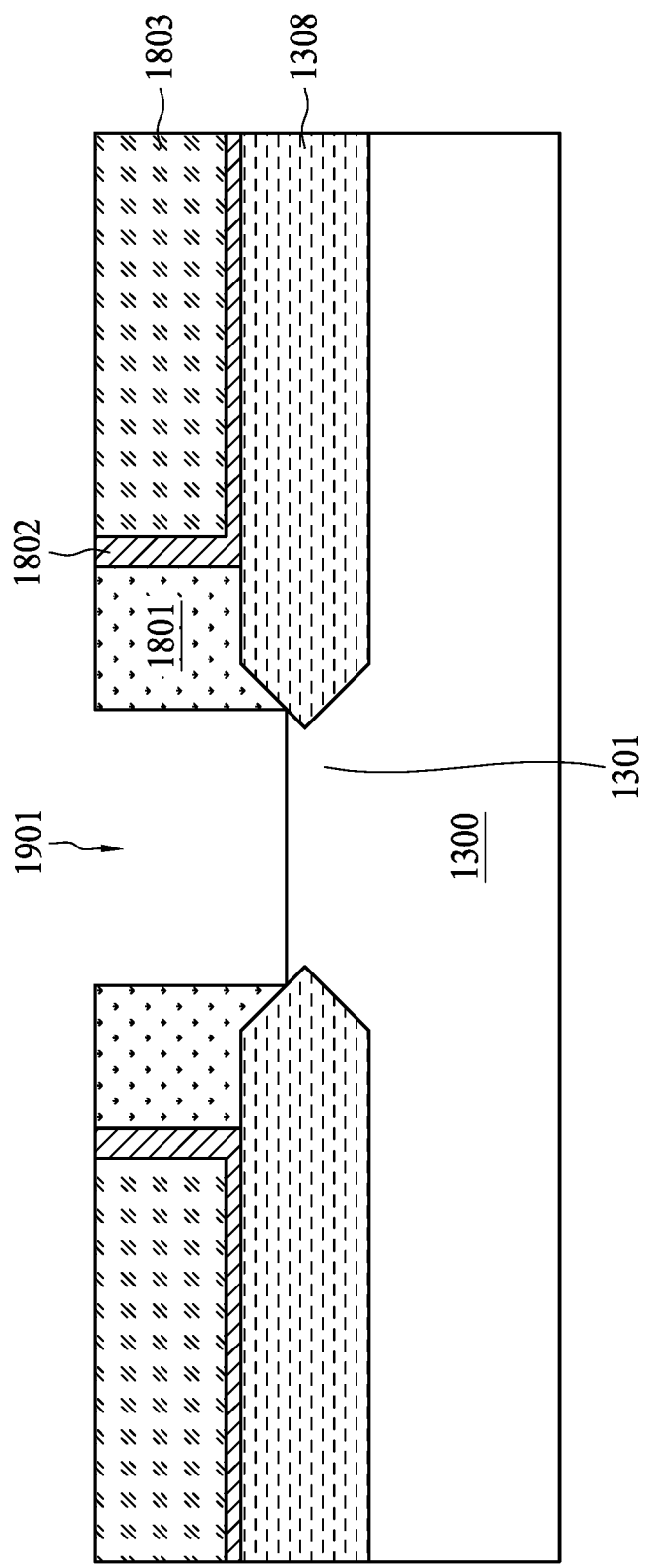

Referring to FIG. 19A, in some embodiments, the dummy gate structure is removed to form a gate trench 1901.

Figure 20A:
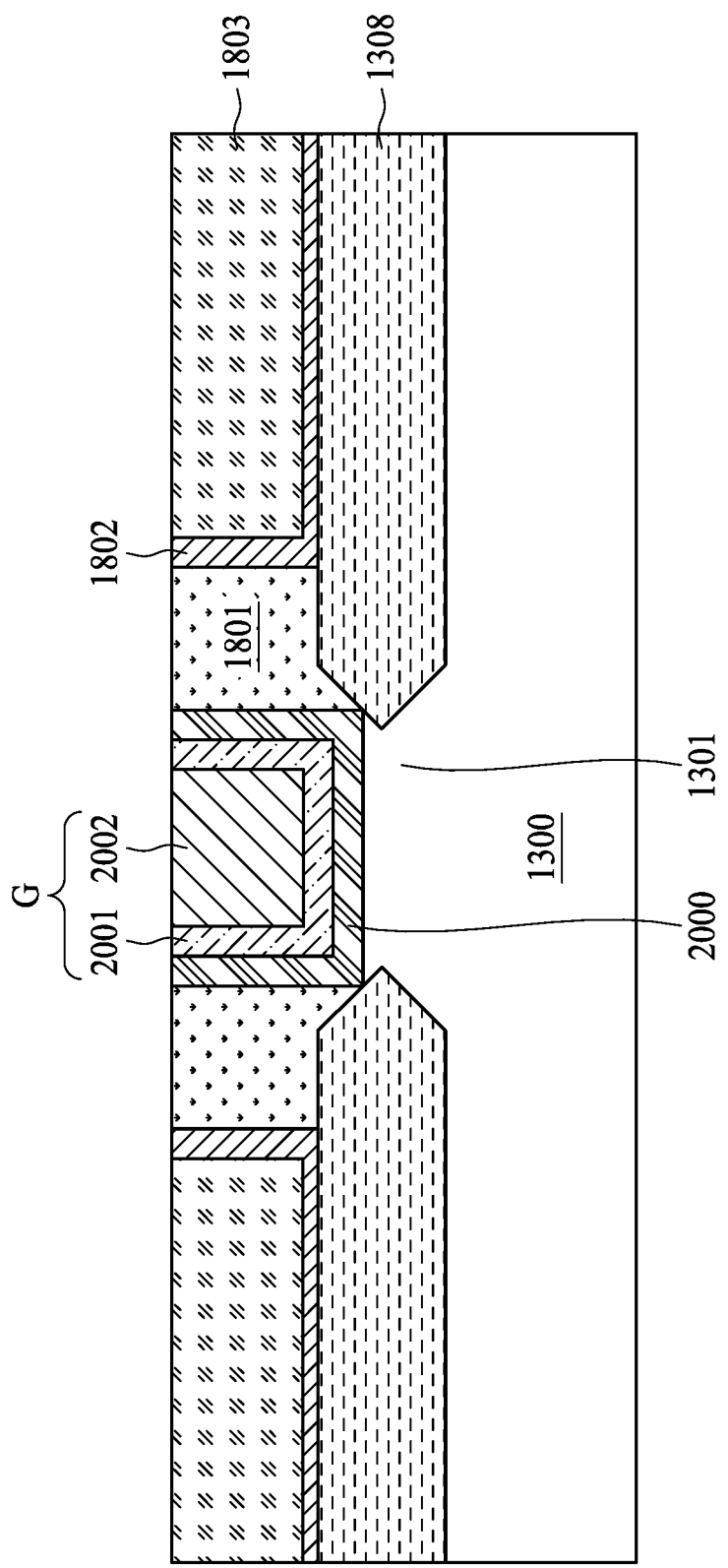

Referring to FIG. 20A, in some embodiments, a gate dielectric 2000, a work function metal 2001 and a metal gate fill material 2002 are formed in the gate trench 1901. A planarization operation such as CMP operation is then performed to remove excessive work function metal 2001 and metal gate fill material 2002 over the dielectric layer 1803, forming the gate structure G. In some embodiments, the gate structure G includes the work function metal 2001 and the metal gate fill material 2002 functioned as gate electrode.

The work function metal 2001 may be a multi-layer structure. In some embodiments, the work function metal 2001 may be any metal material suitable for forming a metal gate or portion thereof, including work function layers, liner layers, interface layers, seed layers, adhesion layers, barrier layers, etc. The metal gate fill material 2002 may be deposited to substantially or completely fill the remainder of the trench.

Figure 21A:
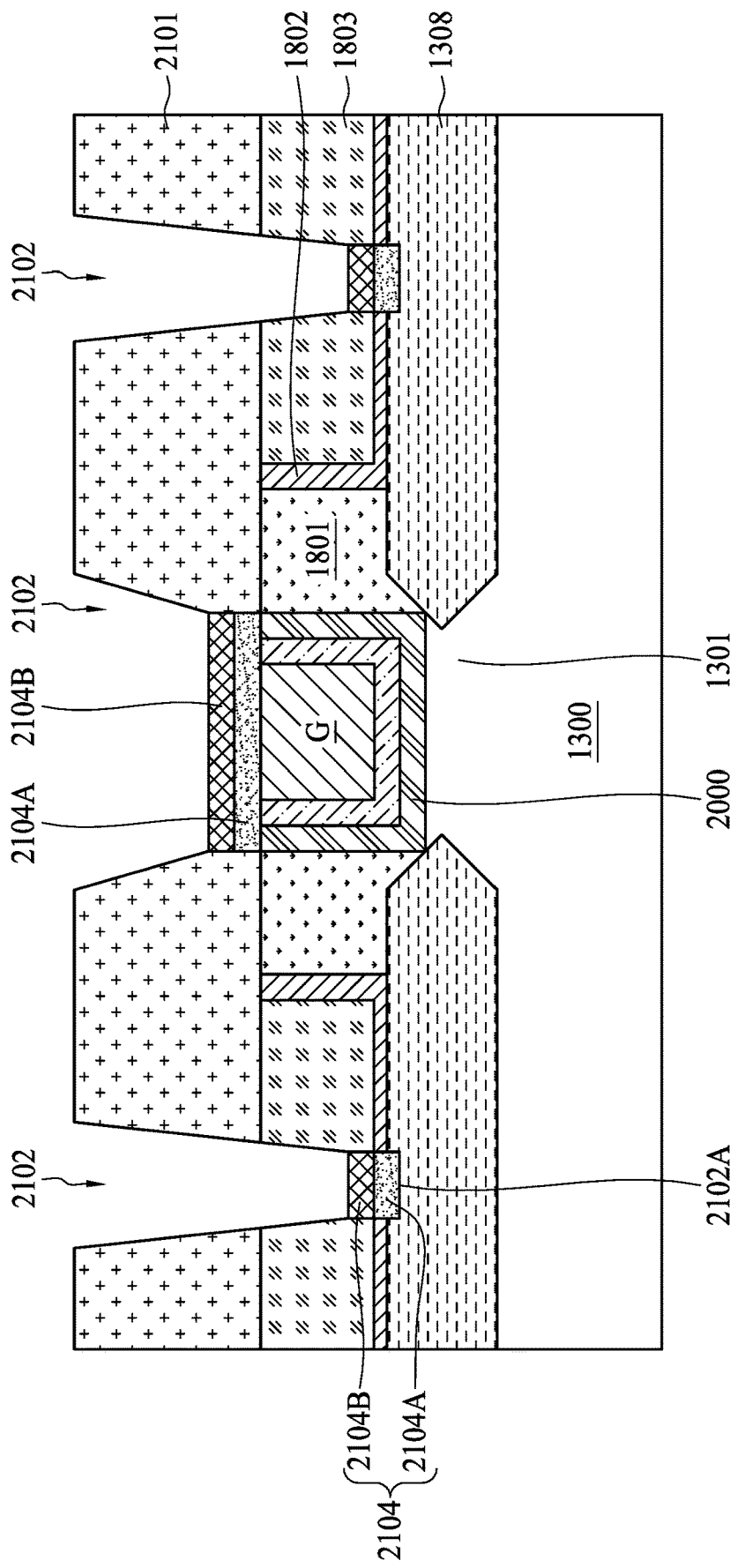
Figure 21B:
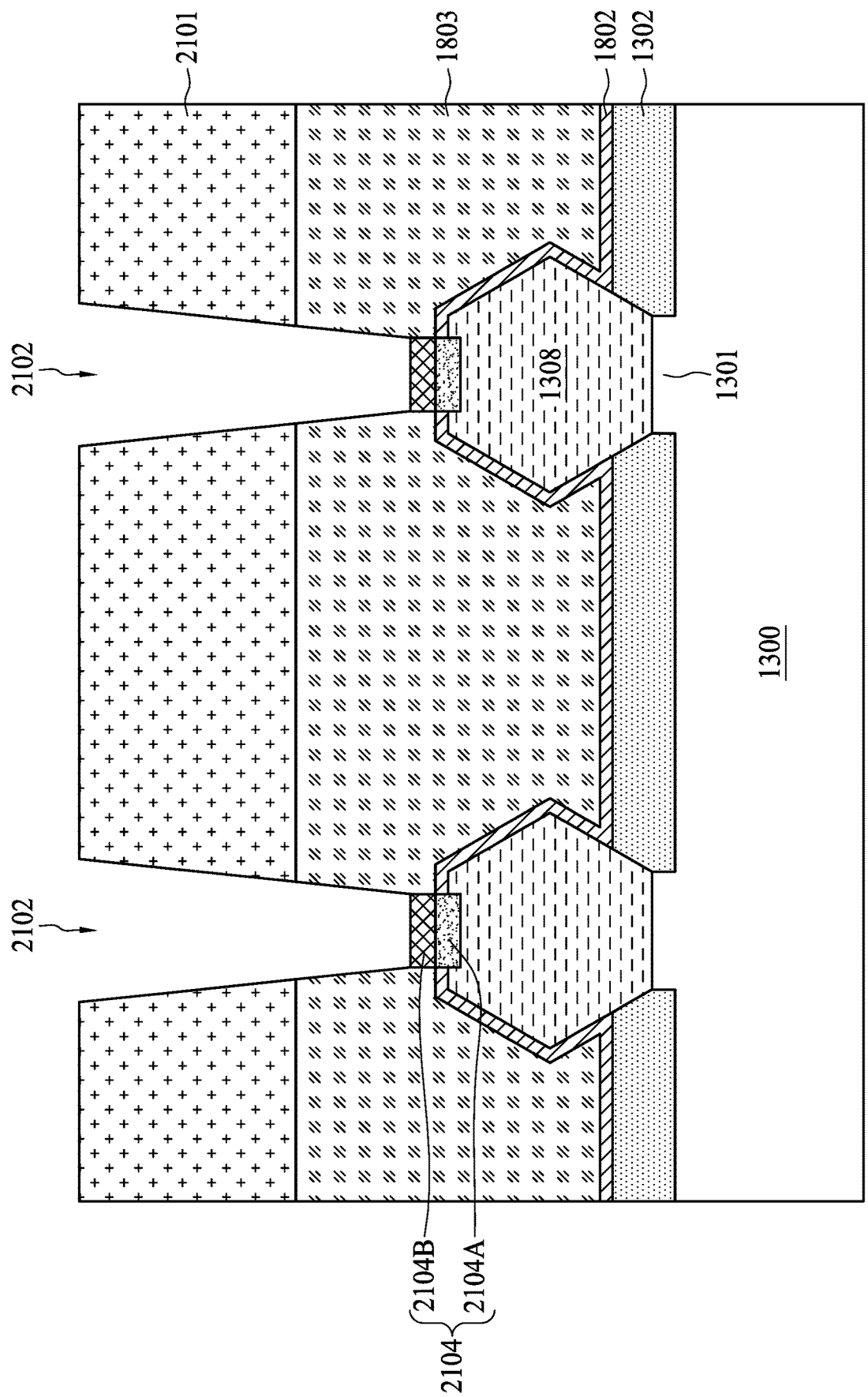

Referring to FIG. 21A and FIG. 21B, in some embodiments, a dielectric layer 2101 is formed over the gate structure G. A plurality of trenches 2102 or enclosures are formed in the dielectric layer 1803, or in the dielectric 183 and the dielectric layer 2101. In some embodiments, a conductive layer 2104 and a sacrificial layer (not shown in FIG. 19A and FIG. 19B) are formed. The entire sacrificial layer and a portion of the conductive layer 2104 are removed from the trench 2102 as described in FIG. 4, FIG. 5 and FIG. 6, and FIG. 7, and here is omitted for brevity. Similar to FIG. 7, at least a portion of a conductive layer 2104 may remain over the bottom 2102A of the trench 2102. The remaining portion of conductive layer 2104 may include a silicide layer 2104A and a capping layer 2104B. The conductive layer 2104 may also be formed similar to FIG. 9, FIG. 10, FIG. 11 and FIG. 12, and here is omitted for brevity. Additionally, the barrier layer may be formed before the forming of the conductive layer, though not shown.

Figure 22A:
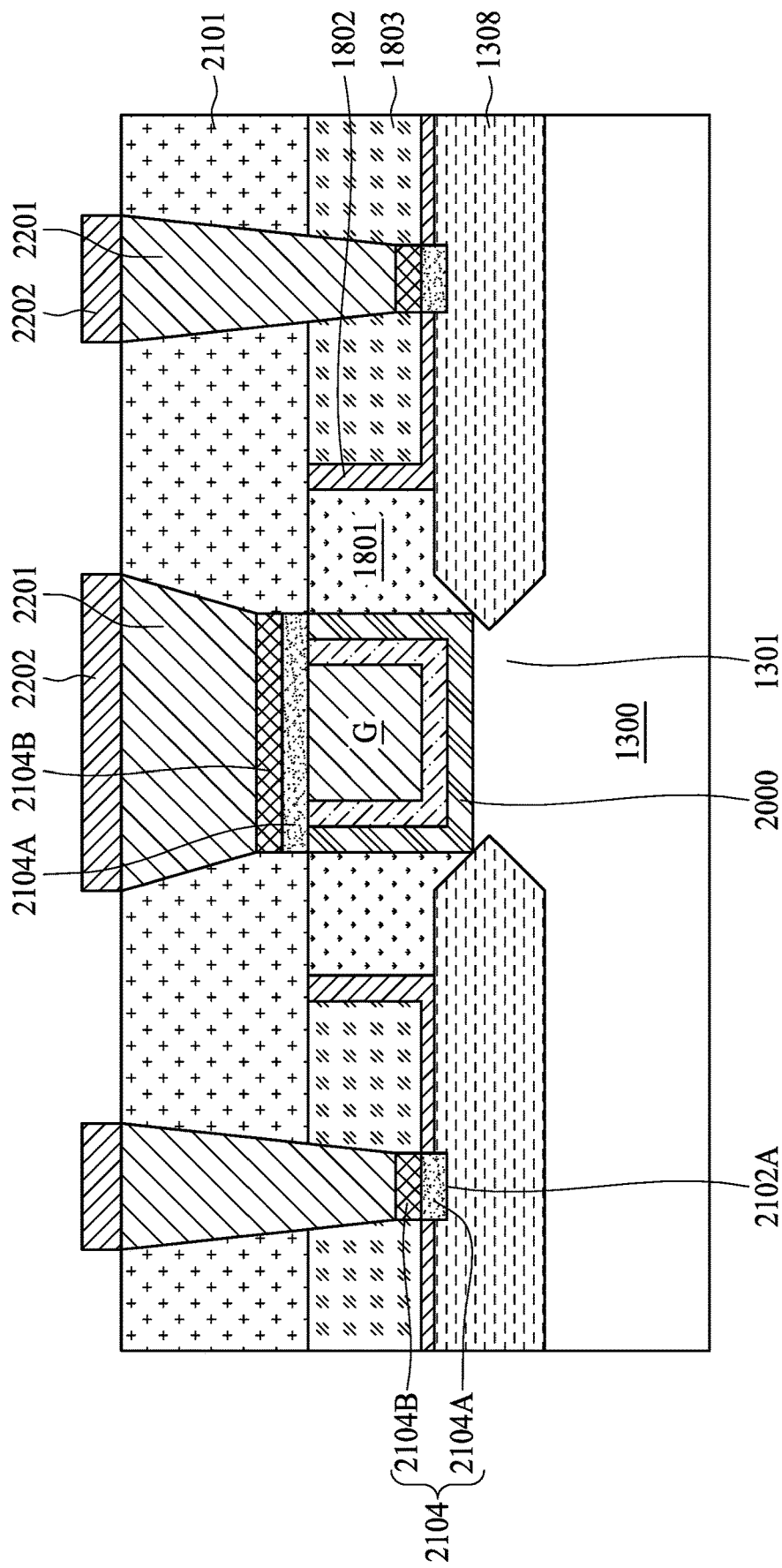
Figure 22B:
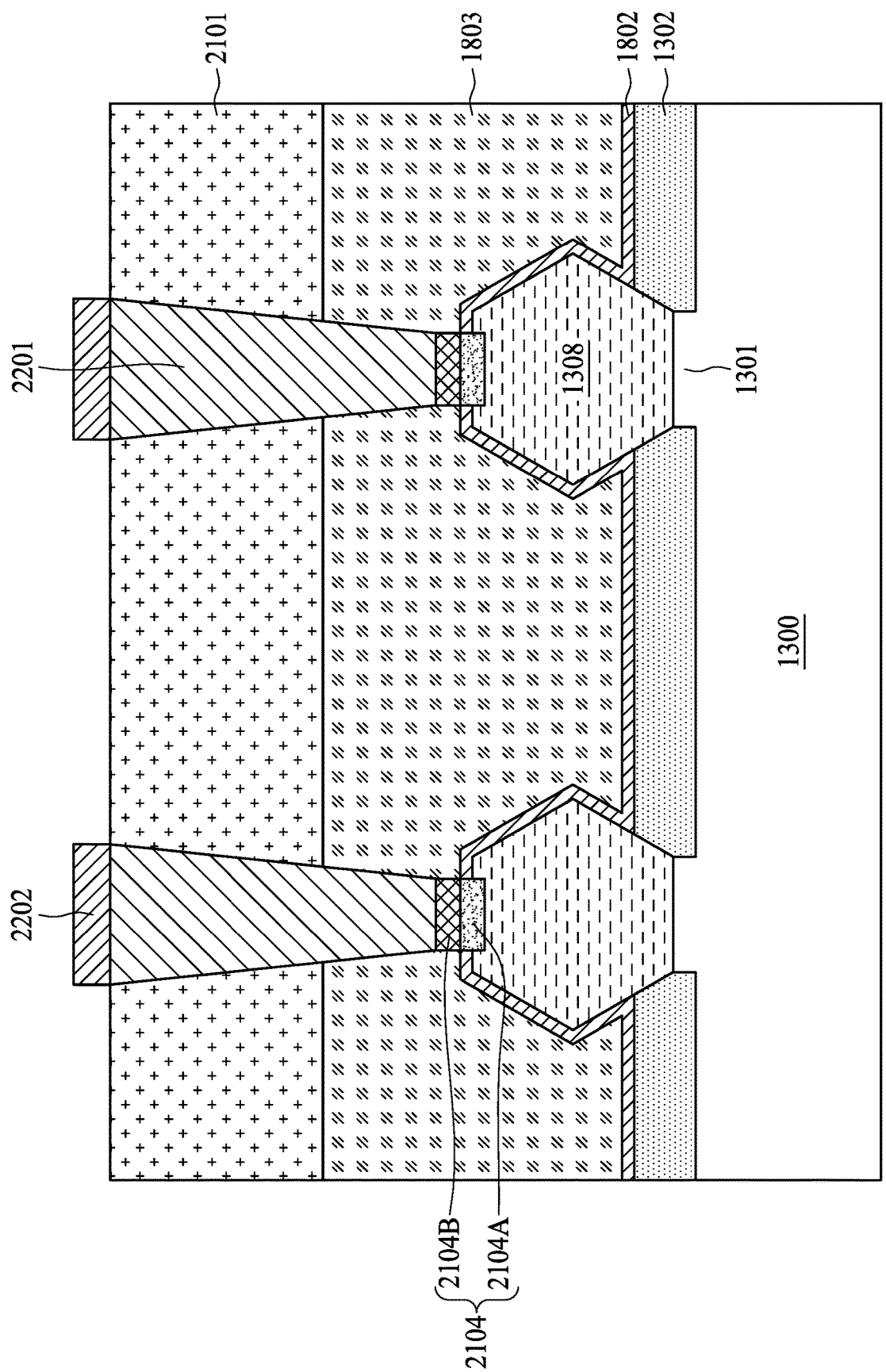

Referring to FIG. 22A and FIG. 22B, a plurality of conductive vias 2201 are formed in the dielectric layer 1803 and the dielectric layer 2101 to electrically connect the gate structure G with the metal lines 2202, and to electrically connected the source/drain regions 1308 with the metal lines 2202. The forming of the conductive vias 2201 are similar to the operations described in FIG. 7 and FIG. 11, and here is omitted for brevity.

Examples of devices that can benefit from one or more embodiments of the present disclosure are semiconductor structures such as, for example but not limited, a planar metal-oxide-semiconductor field effect transistor (MOSFET) or a fin FET (FinFET) device. The FinFET device, for example, may be a complementary MOS (CMOS) device including a p-type MOS FinFET device and an n-type MOS FinFET device. It is understood that the application should be not limited to a particular type of device, except as specifically claimed.

In one or more embodiments of the present disclosure, a sacrificial layer is formed in a trench over a conductive layer such as a silicide layer and a capping layer. The sacrificial layer has a thicker thickness in the bottom of the trench, and a thinner thickness on the sidewall of the trench. The thicker thickness of the sacrificial layer in the bottom of the trench helps to protect the underneath conductive layer because the sacrificial layer on the sidewall of the trench with thinner thickness will be removed faster as well as the conductive layer on the sidewall of the trench. As a result, the dimension and sidewall profile of the trench can be preserved, and the conductive layer in the bottom of the trench can be undamaged after the sacrificial layer with thicker thickness in the bottom of the trench is removed. The preserved dimension and sidewall profile of the trench can help to improve the gap-fill ability of subsequent conductive via material, and maintain the conductivity of the conductive via. The sacrificial layer may include a metal oxide layer, which can be formed by PVD in an in-situ manner, which may increase the manufacturing efficiency.

According to some embodiments of the present disclosure, a method for manufacturing a semiconductor structure is provided. The method includes following operations. A dielectric layer is formed over a semiconductor substrate. A trench in the dielectric layer is formed, wherein the trench includes a bottom exposing a portion of the semiconductor substrate and a sidewall. A liner conductive layer is formed in the trench, wherein the liner conductive layer includes a first conductive portion over the bottom of the trench, and a second conductive portion over the sidewall of the trench. A liner sacrificial layer is formed over the liner conductive layer, wherein the liner sacrificial layer includes a first sacrificial portion over the first conductive portion, and a second sacrificial portion over the second conductive portion, and a first thickness of the first sacrificial portion measured along a first direction substantially parallel to a depth direction of the trench is larger than a second thickness of the second sacrificial portion measured along a second direction substantially perpendicular to the depth direction of the trench. The first sacrificial portion and the second sacrificial portion of the liner sacrificial layer, and the second conductive portion of the liner conductive layer are removed, with at least a portion of the first conductive portion remaining over the bottom of the trench.

According to some embodiments, a method for manufacturing a semiconductor structure is provided. The method includes following operations. A semiconductor substrate having a doped semiconductor region is provided. A dielectric layer is formed over a semiconductor substrate. A trench exposing the doped semiconductor region is formed in the dielectric layer, wherein the trench includes a sidewall. A silicide layer is formed in the trench, wherein the silicide layer is over the doped semiconductor region and the sidewall of the trench. A capping layer is formed over the silicide layer. A sacrificial layer is formed over the capping layer. The sacrificial layer is removed along with a portion of the silicide layer and a portion of the capping layer from the sidewall of the trench.

According to some embodiments, a method for manufacturing a semiconductor structure is provided. The method includes following operations. A semiconductor substrate is provided. A dielectric layer having a trench is formed over the semiconductor substrate. The trench includes a bottom and a sidewall. A conductive layer is formed in the trench, wherein the conductive layer comprises a first conductive portion over the bottom of the trench, and a second conductive portion over the sidewall of the trench. A sacrificial layer is formed over the conductive layer by a physical vapor deposition (PVD) operation. The sacrificial layer is removed along with the second conductive portion over the sidewall of the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, the method comprising:
   forming a dielectric layer over a semiconductor substrate;
   forming a trench in the dielectric layer, wherein the trench includes a bottom exposing a portion of the semiconductor substrate, and a sidewall;
   forming a liner conductive layer in the trench, wherein the liner conductive layer comprises a first conductive portion over the bottom of the trench, and a second conductive portion over the sidewall of the trench;
   forming a liner sacrificial layer over the liner conductive layer, wherein the liner sacrificial layer comprises a first sacrificial portion over the first conductive portion, and a second sacrificial portion over the second conductive portion, and a first thickness of the first sacrificial portion measured along a first direction substantially parallel to a depth direction of the trench is larger than a second thickness of the second sacrificial portion measured along a second direction substantially perpendicular to the depth direction of the trench; and
   removing the first sacrificial portion and the second sacrificial portion of the liner sacrificial layer, and the second conductive portion of the liner conductive layer, with at least a portion of the first conductive portion remains over the bottom of the trench.

2. The method of claim 1, wherein the first sacrificial portion and the second sacrificial portion of the liner sacrificial layer, and the second conductive portion of the liner conductive layer are removed in an in-situ manner.

3. The method of claim 1, wherein the liner conductive layer comprises a silicide layer over the trench, and a liner capping layer over the silicide layer.

4. The method of claim 3, wherein the forming of the liner conductive layer further comprises:
   forming the silicide layer in the trench; and
   forming the liner capping layer over the silicide layer.

5. The method of claim 3, wherein the forming of the liner conductive layer further comprises:
   forming a metal layer in the trench, wherein the metal layer is contact with the portion of the semiconductor substrate exposed through the trench;
   forming the silicide layer by reacting the metal layer with the portion of the semiconductor substrate exposed through the trench; and
   nitridizing the metal layer to form the liner capping layer.

6. The method of claim 3, wherein the forming of the liner conductive layer further comprises:
   forming a metal layer in the trench, wherein the metal layer is contact with the portion of the semiconductor substrate exposed through the trench;
   forming the silicide layer by reacting the metal layer with the portion of the semiconductor substrate exposed through the trench; and
   forming the liner capping layer over the silicide layer.

7. The method of claim 3, wherein the silicide layer and the liner capping layer remain over the bottom of the trench after the removing the first sacrificial portion and the second sacrificial portion of the liner sacrificial layer, and the second conductive portion of the liner conductive layer.

8. The method of claim 1, wherein a ratio of the first thickness to the second thickness is greater than or equal to 4.

9. The method of claim 1, further comprising:
   forming a conductive via in the trench after the removing the first sacrificial portion and the second sacrificial portion of the liner sacrificial layer, and the second conductive portion of the liner conductive layer.

10. The method of claim 1, further comprising forming a liner barrier over the sidewall of the trench.

11. A method for manufacturing a semiconductor structure, the method comprising:
    providing a semiconductor substrate having a doped semiconductor region;
    forming a dielectric layer over a semiconductor substrate;
    forming a trench exposing the doped semiconductor region in the dielectric layer, wherein the trench includes a sidewall;
    forming a silicide layer in the trench, wherein the silicide layer is over the doped semiconductor region and the sidewall of the trench;
    forming a capping layer over the silicide layer;
    forming a sacrificial layer over the capping layer; and
    removing the sacrificial layer along with a portion of the silicide layer and a portion of the capping layer from the sidewall of the trench.

12. The method of claim 11, wherein the portion of the sacrificial layer and the portion of the capping layer are removed in an in-situ manner.

13. The method of claim 11, wherein the sacrificial layer comprises a first sacrificial portion over the doped semiconductor region, and a second sacrificial portion over the sidewall.

14. The method of claim 13, wherein a first thickness of the first sacrificial portion measured along a first direction substantially parallel to a depth direction of the trench is larger than a second thickness of the second sacrificial portion measured along a second direction substantially perpendicular to the depth direction of the trench.

15. The method of claim 14, further comprising forming a barrier layer in contact with the sidewall of the trench.

16. The method of claim 11, wherein the forming the sacrificial layer comprises:
    forming a metal layer over the capping layer; and
    oxidizing the metal layer to form the sacrificial layer.

17. A method for manufacturing a semiconductor structure, the method comprising:
    providing a semiconductor substrate;
    forming a dielectric layer having a trench over the semiconductor substrate, wherein the trench includes a bottom and a sidewall;
    forming a conductive layer in the trench, wherein the conductive layer comprises a first conductive portion over the bottom of the trench, and a second conductive portion over the sidewall of the trench;
    forming a sacrificial layer over the conductive layer by a physical vapor deposition (PVD) operation, wherein a first thickness of the sacrificial layer over the bottom of the trench is thicker than a second thickness of the sacrificial layer over the sidewall of the trench; and
    removing the sacrificial layer along with the second conductive portion from the sidewall of the trench.

18. The method of claim 17, wherein the forming of the sacrificial layer comprises:
    forming a metal layer over the conductive layer in a PVD chamber; and
    exposing the metal layer to an oxygen-containing environment to form a metal oxide layer as the sacrificial layer.

19. The method of claim 17, wherein the first conductive portion of the conductive layer comprises a capping layer and a silicide layer, and the silicide layer is sandwiched between the capping layer and the semiconductor substrate.

20. The method of claim 17, wherein the bottom of the trench exposes a doped semiconductor region of the semiconductor substrate.

* * * * *